US010598736B2

(12) United States Patent
Luan et al.

(10) Patent No.: US 10,598,736 B2
(45) Date of Patent: Mar. 24, 2020

(54) METHOD FOR IDENTIFYING A SYSTEM ANOMALY IN A POWER DISTRIBUTION SYSTEM

(75) Inventors: Wenpeng Luan, Burnaby (CA); Wilsun Xu, Edmonton (CA); Brian Harapnuk, Burnaby (CA)

(73) Assignee: British Columbia Hydro and Power Authority, Vancouver (CA)

( * ) Notice: Subject to any disclaimer, the term of this patent is extended or adjusted under 35 U.S.C. 154(b) by 745 days.

(21) Appl. No.: 14/418,414

(22) PCT Filed: Jul. 31, 2012

(86) PCT No.: PCT/CA2012/000739
§ 371 (c)(1),
(2), (4) Date: Jul. 17, 2015

(87) PCT Pub. No.: WO2014/019055
PCT Pub. Date: Feb. 6, 2014

(65) Prior Publication Data
US 2015/0316620 A1     Nov. 5, 2015

(51) Int. Cl.
*G01R 31/40*     (2020.01)
*G01R 19/25*     (2006.01)
(Continued)

(52) U.S. Cl.
CPC ......... *G01R 31/40* (2013.01); *G01R 19/2506* (2013.01); *H02J 3/00* (2013.01);
(Continued)

(58) Field of Classification Search
CPC .... G01R 31/40; G01R 31/025; G01R 31/343; G01R 31/1272; G01R 31/088;
(Continued)

(56) References Cited

U.S. PATENT DOCUMENTS 4,398,255 A * 8/1983 Premerlani ............ H02H 3/382
361/80
4,812,995 A * 3/1989 Girgis ...................... H02H 3/40
324/512
(Continued)

FOREIGN PATENT DOCUMENTS

| JP | 2002 199579 A | 7/2002 |
|---|---|---|
| JP | 2009159735 A | 7/2009 |
| WO | WO 2014/019055 A1 | 2/2014 |

OTHER PUBLICATIONS

Marian Anghel abd et al, "Stochastic Model for Power Grid Dynamics", Proceedings of the 40th Hawaii International Conference on System Sciences—2007.*

(Continued)

*Primary Examiner* — Janet L Suglo
*Assistant Examiner* — Douglas Kay
(74) *Attorney, Agent, or Firm* — Klarquist Sparkman, LLP

(57) ABSTRACT

A method for identifying a system anomaly in a power distribution system is described herein. The system anomaly may indicate a non-technical loss or a topology error, including schematic entry errors and component modelling errors in the power distribution system. The method includes a) selecting a common coupling point in the power distribution system, wherein downstream branches are connected to the common coupling point; b) determining voltage estimates of the common coupling point according to electrical measurements from the downstream branches; and c) identifying the system anomaly by determining whether a detection criterion is satisfied using the voltage estimates.

25 Claims, 15 Drawing Sheets

(51) Int. Cl.
*H02J 13/00* (2006.01)
*H02J 3/00* (2006.01)

(52) U.S. Cl.
CPC ...... *H02J 13/0006* (2013.01); *G01R 19/2513* (2013.01); *Y02E 60/74* (2013.01); *Y04S 10/30* (2013.01)

(58) Field of Classification Search
CPC ............ G01R 19/2506; G01R 19/2513; H02H 1/0015; H02J 3/00; H02J 13/0006; Y02E 60/74; Y04S 10/30
USPC .......................................................... 702/58
See application file for complete search history.

(56) References Cited

U.S. PATENT DOCUMENTS

| | | | | |
|---|---|---|---|---|
| 6,313,752 | B1* | 11/2001 | Corrigan | H02H 7/263 324/76.13 |
| 6,597,180 | B1* | 7/2003 | Takaoka | G01R 31/088 324/512 |
| 7,566,987 | B2 | 7/2009 | Black et al. | |
| 7,781,919 | B2 | 8/2010 | Black et al. | |
| 9,366,227 | B2* | 6/2016 | Garcia | H02J 3/18 |
| 2001/0036047 | A1* | 11/2001 | Macbeth | H02H 1/0015 361/42 |
| 2002/0091503 | A1* | 7/2002 | Carrillo | G06F 17/5004 703/2 |
| 2007/0055889 | A1* | 3/2007 | Henneberry | G01R 19/2513 713/186 |
| 2008/0204954 | A1* | 8/2008 | Bickel | H02H 3/247 361/86 |
| 2009/0276170 | A1 | 11/2009 | Bickel | |
| 2009/0319093 | A1* | 12/2009 | Joos | H02J 3/14 700/297 |
| 2010/0268579 | A1* | 10/2010 | Momoh | G06Q 10/06 705/14.1 |
| 2011/0058296 | A1* | 3/2011 | Orchowski | H05B 39/044 361/88 |
| 2011/0190973 | A1* | 8/2011 | Giles | B60W 50/0205 701/31.4 |
| 2012/0049879 | A1* | 3/2012 | Crites | H02S 50/10 324/761.01 |
| 2012/0112549 | A1* | 5/2012 | Perisic | H02M 3/33507 307/75 |
| 2012/0193984 | A1* | 8/2012 | Krok | H02J 3/1807 307/31 |
| 2013/0035885 | A1* | 2/2013 | Sharon | G06F 17/509 702/61 |
| 2013/0038123 | A1* | 2/2013 | Wilkins | H02J 3/01 307/18 |

OTHER PUBLICATIONS

Atish K. Ghosh and et al, "Distribution Circuit State Estimation Using a Probabilistic Approach", IEEE Transactions on Power Systems, vol. 12, No. 1, Feb. 1997.*
Atish K. Ghosh and et al, "Load Modeling for Distribution Circuit State Estimation", IEEE Transactions on Power Delivery, vol. 12, No. 2, Apr. 1997.*
H. Wang and et al. "A Revised Branch Current-Based Distribution System State Estimation Algorithm and Meter Placement Impact", IEEE Transactions on power systems, vol. 19, No. 1, Feb. 2004.*
D. Shirmohammad, "Service restoration in distribution networks via network reconfiguration", IEEE Transactions on Power Delivery, vol. 7, No. 2, Apr. 1992.*
G. W. Chang and et al. "An Improved Backward/Forward Sweep Load Flow Algorithm for Radial Distribution Systems", IEEE Transactions on power systems, vol. 22, No. 2, May 2007.*
J.M. Avenado and et al, "Active correlation technology applied to maintenance program based on voltage sags control", Electr Eng (2010) 92:7-16, © Springer-Verlag 2010.*
IEEE-std-519-1992 ("IEEE Recommended Practices and Requirements for Harmonic Control in Electrical Power Systems", IEEE Std 519-1992) (Year: 1992).*
Ghosh1 (A. K. Ghosh and et el, "Distribution Circuit State Estimation Using a Probabilistic Approach", IEEE Transactions on Power Systems, vol. 12, No. 1, Feb. 1997) (Year: 1997).*
Ghosh2 (A. K. Ghosh and et al, "Load Modeling for Distribution Circuit State Estimation", IEEE Transactions on Power Delivery, vol. 12, No. 2, Apr. 1997) (Year: 1997).*
H.E. Mazin, E.E. Nino, W. Xu, and J. Yong. "Study on the Harmonic Contributions of Residential Loads". IEEE Transactions on Power Delivery, 2011, 26(3), pp. 1592-1599.
D. Salles, C. Jiang, W. Xu, W. Freitas, and H.E. Mazin. "Assessing the Collective Harmonic Impact of Modern Residential Loads—Part I: Methodology". *IEEE Transactions on Power Delivery*, 2012, 27(4), pp. 1937-1946.
International Search Report dated Apr. 8, 2013, issued by the Canadian Intellectual Property Office in Corresponding PCT Application No. PCT/CA2012/000739, filed Jul. 31, 2012.
Office action dated Jun. 8, 2018, issued by the Canadian Intellectual Property Office in Canadian Patent No. CA 2,880,502, 8 pages.
English translation of Japanese Patent No. JP 2009159735A, 16 pages.

* cited by examiner

METHOD FOR IDENTIFYING A SYSTEM ANOMALY IN A POWER DISTRIBUTION SYSTEM

CROSS REFERENCE TO RELATED APPLICATION

This is the U.S. National Stage of International Application No. PCT/CA2012/000739, filed Jul. 31, 2012, which was published in English under PCT Article 21(2).

TECHNICAL FIELD

The present disclosure is directed at methods and techniques for identifying a system anomaly in a power distribution system, and more specifically, for identifying a non-technical loss or topology error in a power distribution system.

BACKGROUND

Power losses in the power sector are unpaid energy expenditures that occur in the transmission and distribution of electricity to consumers. Losses are typically categorized as either technical or non-technical. Technical losses occur naturally through power and heat dissipation in electrical system components, including transmission and distribution lines, transformers, and power measurement devices. While technical losses can be minimized, they cannot be altogether avoided. Non-technical losses however, are caused by actions external to the power distribution system, and include the siphoning of electricity through power theft, faulty power measurements, and inaccurate record keeping/accounting.

Power theft typically occurs through the tampering of power meters, or through an illegal and unknown connection to the power grid. These losses not only represent lost income for power companies, but may also require long-term subsidization by other consumers for the power companies to remain operationally viable. Preventing and/or accounting for non-technical losses may also reduce overall power demand.

It is also important for power companies to maintain updated records of their power grid topologies. Topological data includes not only schematic information of the power grid (illustrating how components are connected each other), but also system and component parameters such as distribution wire lengths and sizes, transformer sizes and inductances, conductor impedances, or any measurable electrical characteristics along a distribution branch. As topologies can become unexpectedly modified through expansion of the power grid, or through routine operation and maintenance of distribution wire and related components, it is important to be alerted to unintended or unexpected changes in order to accurately capture the state of the power grid to optimize system operation and electricity distribution to consumers.

Accordingly, a method for detecting a system anomaly in a power distribution system is needed, including the identification of both non-technical losses and topology errors.

BRIEF DESCRIPTION OF THE DRAWINGS

In the accompanying drawings, which illustrate one or more exemplary embodiments.

SUMMARY

Figure 1:
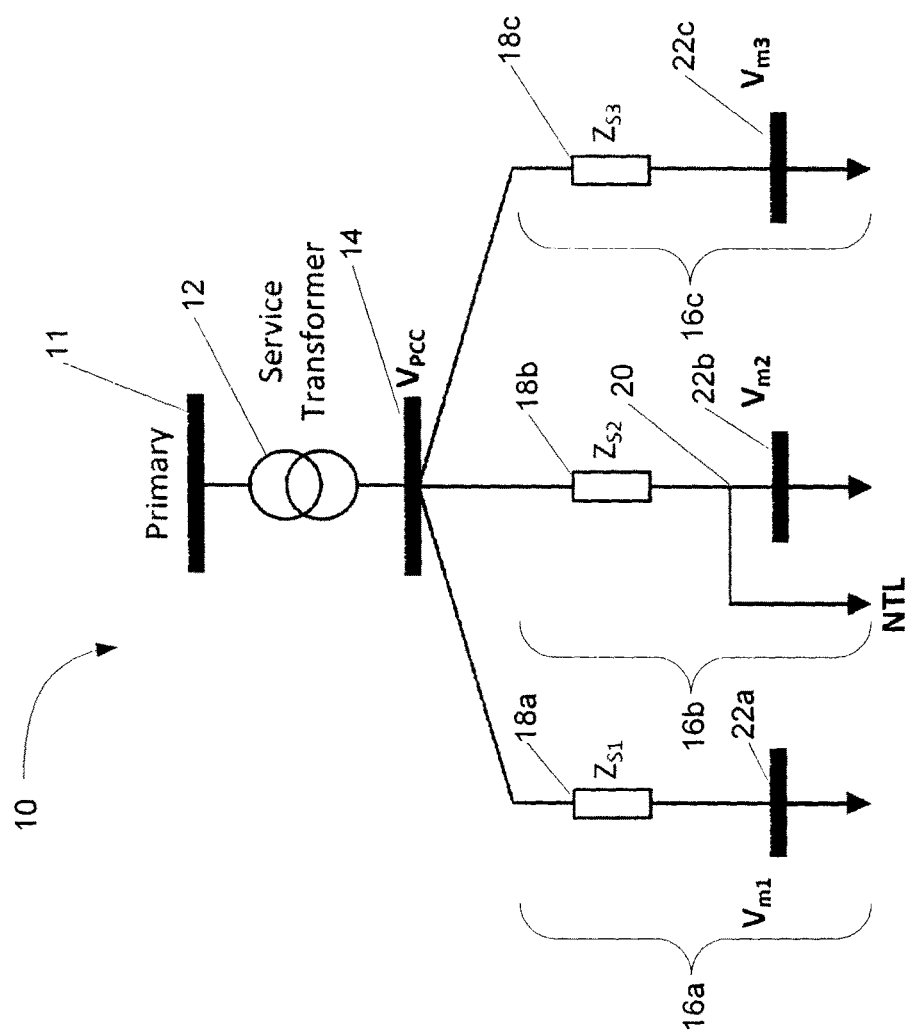
FIG. 1 is an electrical schematic of a power distribution system in a parallel configuration, in which a first embodiment of a method for identifying a system anomaly in the power distribution system is applied.

According to an aspect, there is provided a method for identifying a system anomaly in a power distribution system. The method comprises: a) selecting a common coupling point in the power distribution system, wherein downstream branches are connected to the common coupling point; b) determining voltage estimates of the common coupling point according to electrical measurements from the downstream branches; and c) identifying the system anomaly by determining whether a detection criterion is satisfied using the voltage estimates.

Each of the voltage estimates may be determined according to a voltage measured across one of the downstream branches.

The detection criterion may be satisfied if any of the voltage estimates differ beyond a certain value from a threshold comprising one of the voltage estimates.

The voltage estimates may be normalized, and the system anomaly may be identified according to whether any of the normalized voltage estimates satisfy the detection criterion. The detection criterion may be satisfied if any of the normalized voltage estimates differ beyond a certain range from a threshold comprising one of the normalized voltage estimates.

Voltage estimates from the same branch may be averaged, and the system anomaly may be identified from determining whether any of the averaged voltage estimates satisfy the detection criterion.

A statistical analysis of the voltage estimates may be performed, wherein whether the detection criterion is satisfied depends on the results of the statistical analysis. The voltage estimates may be obtained through samples of the common coupling point obtained over a period of time.

The statistical analysis may comprise: a) incrementing a violation count for each sample containing at least a voltage estimate satisfying a threshold; b) determining a violation ratio by dividing the violation count by the number of samples obtained over the period of time; and c) determining whether the detection criterion is satisfied according whether the violation ratio meets or exceeds a predetermined ratio.

The system anomaly may be located in a downstream branch corresponding to the voltage estimate satisfying the detection criterion.

Electrical measurements may selected from the group consisting of voltage, current, power, energy, time integrated voltage, and time integrated current, and the downstream branches may comprise a meter for measuring the electrical measurements at one of the branches.

The voltage estimates may be determined by summing voltage drops across components upstream of the meter and downstream of the common coupling for a particular branch. An identified system anomaly may be located upstream of the meter.

The system anomaly may comprise a non-technical loss. The magnitude of the non-technical loss may be determined according to the difference between the voltage estimates.

The system anomaly may comprise a topology error. The topology error may comprise an incorrect branch connection, an incorrect transformer impedance, or an incorrect wire impedance. When the topology error comprises an incorrect branch connection, the method may further comprise performing a voltage profile analysis to determine a correct mapping for the incorrect branch connection.

The voltage profile analysis may comprise: a) determining a voltage profile for a branch corresponding to the topology error; b) determining voltage profiles for coupling points in the power distribution system; c) comparing the voltage profile for the branch corresponding to the topology error to the voltage profiles for the coupling points in the power distribution system; and d) mapping the branch corresponding to the topology error to one of the coupling points in the power distribution system according to the results of the comparison in c).

Downstream branches may be coupled in parallel to the common coupling point, or may be coupled to the common coupling point in a cascade configuration.

The common coupling point may be located on a primary or secondary side of the power distribution system.

According to another aspect, a computer readable medium having encoded thereon statements and instructions for executing a method for identifying a system anomaly in a power distribution system, is disclosed. The method comprises: a) selecting a common coupling point in the power distribution system, wherein downstream branches are connected to the common coupling point; b) determining voltage estimates of the common coupling point according to electrical measurements from the downstream branches; and c) identifying the system anomaly by determining whether a detection criterion is satisfied using the voltage estimates.

According to another aspect, a system for identifying a system anomaly in a power distribution system is disclosed. The system comprises: a computer readable medium having encoded thereon statements and instructions for a) selecting a common coupling point in the power distribution system, wherein downstream branches are connected to the common coupling point, b) determining voltage estimates of the common coupling point according to electrical measurements from the downstream branches, and c) identifying the system anomaly by determining whether a detection criterion is satisfied using the voltage estimates; and a processor for executing the statements and instructions on the computer readable medium.

According to another aspect, a method for identifying a system anomaly in a power distribution system is disclosed. The method comprises: (a) determining voltage estimates of a common coupling point to which downstream branches of the power distribution system are commonly coupled, wherein each of the voltage estimates is determined using electrical measurements of the downstream branches, and at least two of the downstream branches are used to determine the voltage estimates; and (b) identifying whether the system anomaly is present in any of the downstream branches by determining whether any of the voltage estimates satisfies a detection criterion.

This summary does not necessarily describe the entire scope of all aspects. Other aspects, features and advantages will be apparent to those of ordinary skill in the art upon review of the following description of specific embodiments.

DETAILED DESCRIPTION

The embodiments described herein are directed towards a system and method for identifying and locating a system anomaly in a power distribution system, which may also be encoded on to a computer readable medium executable by a computer implemented system. A system anomaly comprises, for example, a non-technical loss ("NTL"), or a topology error in power company's asset management information system. The topology error may include schematic entry errors and component modelling errors for the power distribution system. The method can apply to any suitable type of power distribution system, including primary and secondary power distribution systems, and power distribution systems having radial and mesh topologies, including parallel, cascade, and single load configurations. Identification of a non-technical loss can alert power companies to potential power theft, and prompt them to perform further investigation to ascertain the cause and source of the loss. Once located, power companies may appropriately rectify the loss. Similarly, identification of a topology error can prompt further investigation to correct power grid connectivity errors, schematic record errors, component modelling/parameter errors, in order to optimise system operation and electricity distribution to consumers.

Voltage Difference Method

Referring to FIG. 1, there is shown an exemplary secondary power distribution system 10 in a parallel configuration, in which an embodiment of a method for identifying and locating a system anomaly can be applied (hereinafter referred to as the "voltage difference method"). The system 10 comprises a service transformer 12 having a primary winding coupled to an input voltage point 11 and a secondary winding coupled to a common coupling point (also referred to as "CCP") 14. The service transformer 12 steps down a primary voltage at the input voltage point 11 to a secondary voltage at the common coupling point 14 for distribution to consumers. As shown in FIG. 1, a plurality of downstream branches 16a-c (collectively, branches 16) are connected in parallel to the common coupling point 14, including a first branch 16a, a second branch 16b, and a third branch 16c, with each branch distributing electricity to individual customers who receive power from that branch. In this disclosure, "connected" means directly connected with ideally zero impedance between connection points. Accordingly, the common coupling point 14 acts as a distribution point for distributing electricity to downstream branches 16. Each of the branches 16 comprises a service conductor 18a-c (collectively, service conductors 18) and a meter 22a-c (collectively, meters 22). The service conductors 18 represent the impedance of the portion of each branch 16 upstream of the meters 22, and can be modeled using the resistivity and length of the electrical wire or other physical impedances of the branch 16. The meters 22 are used to record each consumer's electrical consumption for billing and payment purposes, and to also help monitor and measure electrical power flow information downstream of each branch 16, including measurement of parameters such as voltage, current, power, and energy, which are useful for the voltage difference method.

A system anomaly is represented by non-technical loss (NTL) 20 shown in FIG. 1 as a draw of current in the second branch 16b between the service conductor 18b and the meter 22b. Since the NTL 20 occurs upstream of the meter 22b, measurements from the second meter 22b fail to accurately reflect the load flow information of the second branch 16b. For example, the meter 22b may measure a current $I_2$ being delivered to a consumer downstream of the meter 22b, which is presumed to be the same current $I_2$ travelling through the entire second branch 16b in the absence of any losses. However, the NTL 20 located upstream of the meter 22b may draw a current of $I_{NTL}$ away from the second branch 16b, which is unmeasured by the meter 22b because it is drawn away from upstream of the meter 22b. Accordingly, the actual current travelling through the entire second branch 16b is $I_2+I_{NTL}$, of which current $I_{NTL}$ corresponds to a non-technical loss which is unaccounted by the meter 22b.

However, the presence of the NTL 20 may be detected in the system 10 of FIG. 1 by obtaining different voltage estimates for the common coupling point 14. If the impedance of the service conductors 18 and electrical measurements from the meters 22 are known, voltage estimates for the common coupling point 14 can be obtained through application of Ohm's law to determine the sum of voltage drops across system components downstream of the common coupling point 14 and upstream of each meter 22 for each branch 16 (for example, service conductors 18 in FIG. 1). Since the actual voltage at the top of the branches 16 must be equal, as they are connected together at the common coupling point 14 and thus have the same electric potential, discrepancies between the voltage estimates derived from the branches 16 may indicate losses or abnormal behavior in a corresponding branch. In the absence of any NTL, all voltage estimates should yield substantially the same values if the electrical parameters (such as wire sizes and lengths, or component values) of the branch are correct. Differing voltage estimates however, suggest an NTL (or system anomaly) in one of the branches 16.

For example, if the meter 22a in the first branch 16a measures a voltage of $V_{m1}$ and a current of $I_1$, a first voltage estimate of the common coupling point 14 can be derived from Ohm's law as follows:

$$V_{PCC1}=V_{m1}+Z_{S1} \cdot I_1 \quad (1)$$

where $Z_{S1}$ is the known impedance of the service conductor 18a in the first branch 16a, and $V_{PCC1}$ is the voltage estimate of the common coupling point 14 derived from measurements of the first branch 16a. $Z_{S1} \cdot I_1$ is the voltage drop across the first service conductor 18a upstream of the meter 22a, which is added to the voltage $V_{m1}$ measured from meter 22a to obtain the first voltage estimate of the common coupling point 14 from the first branch 16a. Using this general approach, voltage estimates of the common coupling point 14 can be obtained from measurements of other branches 16 by appropriately adding the measured voltage to the sum of voltage drops across system components upstream of the meters 22 and downstream of the common coupling point 14.

Similarly, voltage estimates of the common coupling point 14 derived from measurements of the second 16b and third 16c branches are as follows:

$$V_{PCC2}=V_{m2}+Z_{S2} \cdot I_2 \quad (2)$$

$$V_{PCC3}=V_{m3}+Z_{S3} \cdot I_3 \quad (3)$$

where $Z_{S2}$ and $Z_{S3}$ are the known impedances of the second and third service conductors 18b-c, and $V_{m2}$, $V_{m3}$ and $I_2$, $I_3$ are the respective voltage and current measurements from the second and third meters 22b-c.

Under ideal circumstances (i.e. no fluctuations, electrical parameter errors, measurement errors, or NTLs), the voltage estimates derived from all three branches should be the same:

$$V_{PCC1}=V_{PCC2}=V_{PCC3} \quad (4)$$

However, as shown in FIG. 1, if an NTL 20 is present in the second branch 16b, equation (2) should be revised to model the effect of the NTL 20, resulting in a revised voltage estimate for the common coupling point 14 as:

$$V_{Pcc2}=V_{m2}+Z_{S2} \cdot (I_2+I_{NTL}) \quad (5)$$

where $V_{m2}$ and $I_2$ are the respective voltage and current measurements of the meter 22b in the second branch 16b, and $I_{NTL}$ is the current corresponding to the NTL 20. The failure to account for $I_{NTL}$ in the presumed model of equation (2) however, would yield a non-ideal voltage estimate for the common coupling point 14 of:

$$V'_{PCC2}=V_{m2}+Z_{S2} \cdot I_2 \quad (6)$$

which is lower than the revised voltage estimate determined in (5). The difference between the two voltage estimates in (5) and (6) due to the presence of the NTL 20, as derived from second branch 16b measurements is thus:

$$\Delta V_{NTL}=V_{PCC2}-V'_{PCC2}=Z_{S2} \cdot I_{NTL} \quad (7)$$

Therefore, assuming that $V_{PCC1}$ and $V_{PCC3}$ are reasonably accurate estimates of the voltage at the common coupling point 14 without any NTL or electrical parameter errors in their respective branches, combining equations (4)-(7) would yield:

$$V'_{PCC2}+\Delta V_{NTL}=V_{PCC1}=V_{PCC3} \quad (8)$$

from which clearly:

$$V'_{PCC2} < V_{PCC1} = V_{PCC3} \quad (9)$$

Therefore, it can be seen from equation (9) that by assuming at least one of the voltage estimates of the common coupling point 14 is reasonably accurate, the voltage estimate corresponding to one of the branches 16 containing the NTL will differ due to the failure to account for the voltage difference $\Delta V_{NTL}$ caused by the NTL at that branch. Accordingly, by comparing voltage estimates of the common coupling point 14 derived from measurements of different branches 16, the NTL 20 can be identified as corresponding to the branch having one of the lower, or the lowest relative voltage estimate for the common coupling point 14. Further, the magnitude of the NTL ($I_{NTL}$) can be estimated from equation (7) based on the difference between voltage estimates of the common coupling point 14. As will be explained in more detail below, by determining voltage estimates over a period of time, and performing statistical analysis of the voltage estimates, profiling information can be derived to identify important NTL trends and characteristics, such as NTL recurrence patterns, durations, and time frames.

Figure 2:
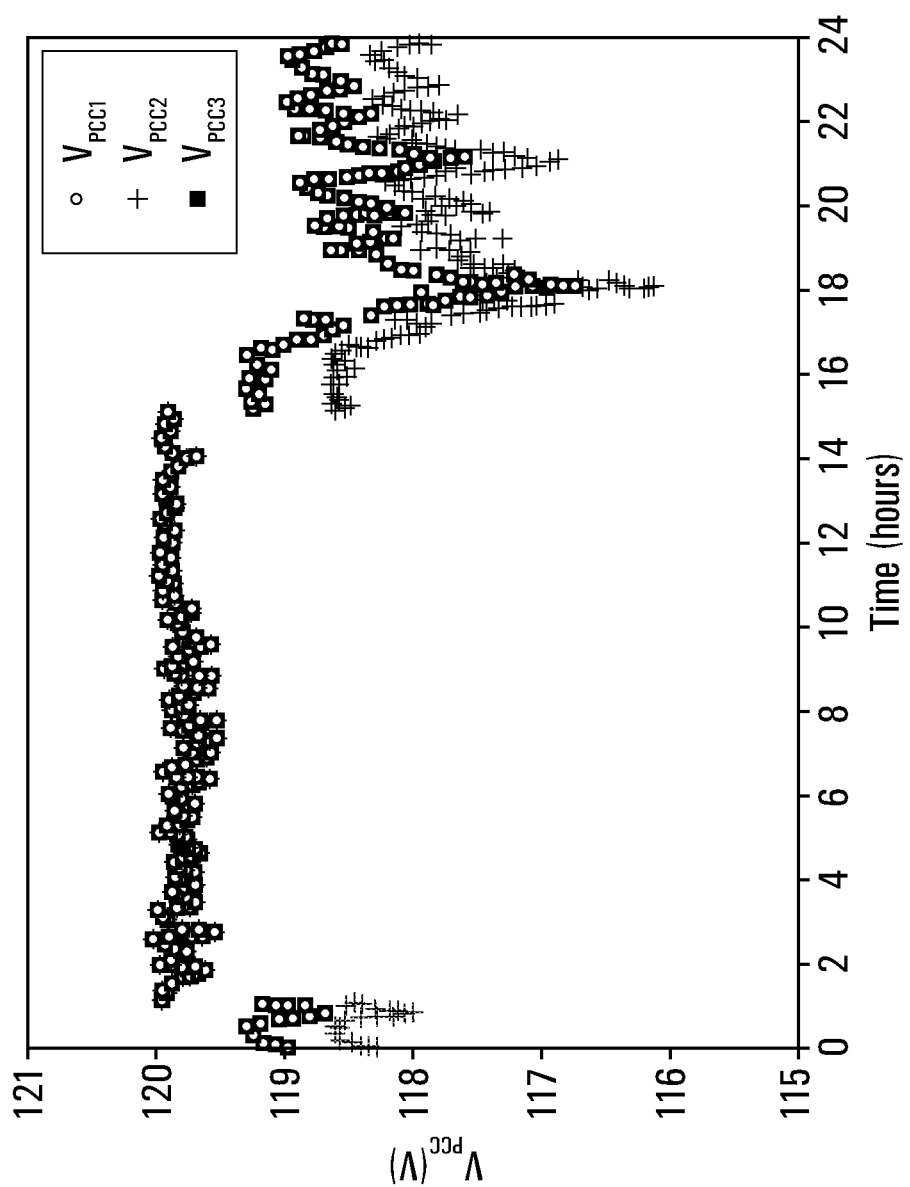
FIG. 2 is an exemplary graph illustrating voltage estimates over time at a common coupling point in the power distribution system of FIG. 1.

Referring to FIG. 2, there is shown an exemplary plot of voltage estimates of the common coupling point 14, performed over time using measurements from each of the first branch 16a, second branch 16b, and third branch 16c in FIG. 1. As shown in FIG. 2, from about T=1 to 15 hours, the voltage estimates from each of the branches 16 appear relatively constant and substantially equal, which suggests no NTL during this period. However, from about T=0 to 1, and 15 to 24 hrs, there is substantial variance between the voltage estimates; while $V_{PCC1}$ substantially mirrors $V_{PCC3}$, $V_{PCC2}$ appears notably lower than the other two voltage estimates. Accordingly, the plot in FIG. 2 suggests that there may be an NTL within the second branch 16b during the period of T=0 to 1, and 15 to 24 hrs.

Figure 3:
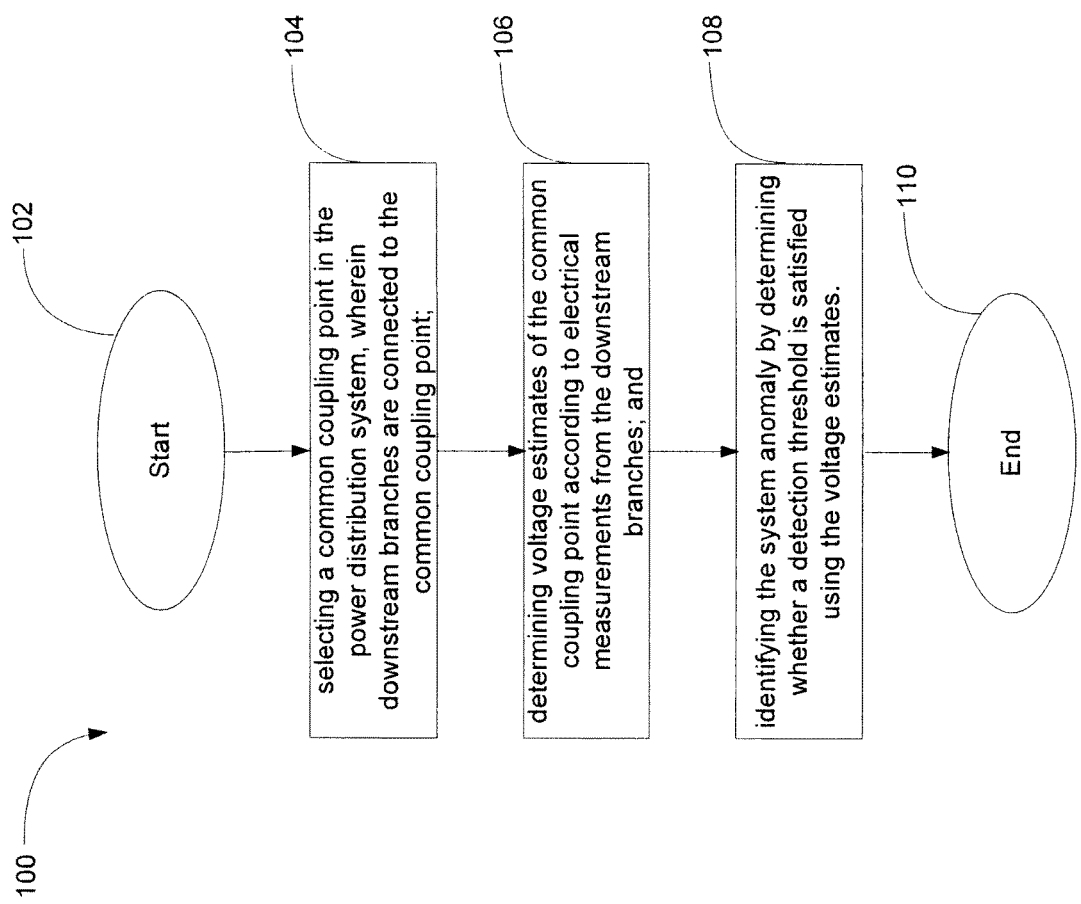
FIG. 3 is a flow chart illustrating the first embodiment of the method for identifying a system anomaly.

Referring to FIG. 3, a flow chart is shown illustrating the disclosed voltage difference method 100, according to an embodiment. The voltage difference method 100 may also be executed by a computer implemented system or processor as follows. The method begins at block 102. At block 104, the processor selects a common coupling point in the power distribution system, wherein downstream branches are connected to the common coupling point. At block 106, the processor determines voltage estimates of the common coupling point according to electrical measurements from the downstream branches. At block 108, the processor identifies the system anomaly by determining whether a detection criterion is satisfied using the voltage estimates. The method ends at block 110.

Post Data Analysis

If voltage estimates of the common coupling point 14 are obtained from different downstream branches over a period of time (as shown in FIG. 2, for example), post data collection statistical analysis (hereinafter "post data analysis") can be performed to i) attenuate fluctuations or errors in the voltage estimates, and ii) improve accuracy in the identification of a system anomaly. Post data analysis can also provide system anomaly profiling information to identify important trends and characteristics, such as system anomaly recurrence patterns, durations and time frames.

In certain embodiments, post data analysis comprises averaging or normalizing the different voltage estimates obtained over time to attenuate voltage fluctuations or measurement errors. Averaging or normalizing not only scales the effect of potential fluctuations caused by the meter, noise, interference, or electricity use by a consumer, but also facilitates subsequent comparison of the voltage estimates when used to identify a system anomaly or NTL. For example, voltage estimates derived from a particular branch at different times can be averaged to provide an average voltage estimate from that branch. A system anomaly can then be identified if the average voltage estimate satisfies a detection criterion.

Figure 4:
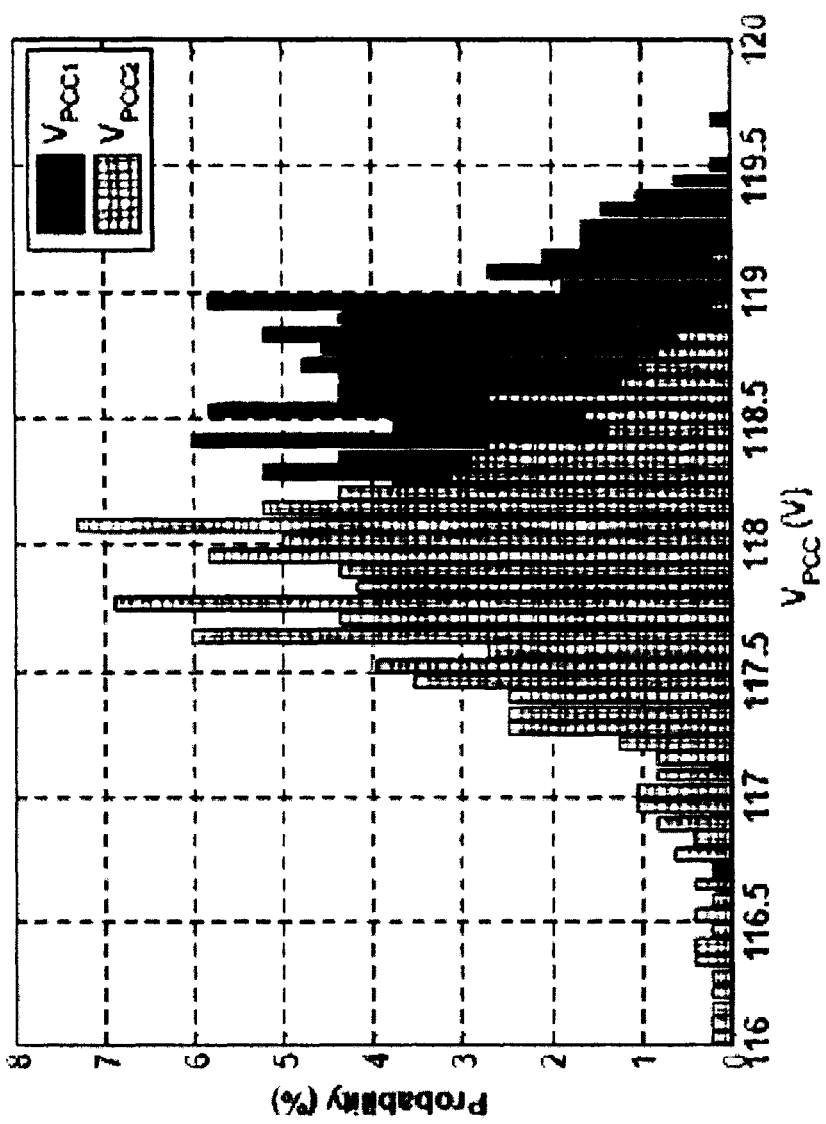
FIG. 4 is a statistical distribution of voltage estimates at the common coupling point in the power distribution system of FIG. 1.
Figure 5:
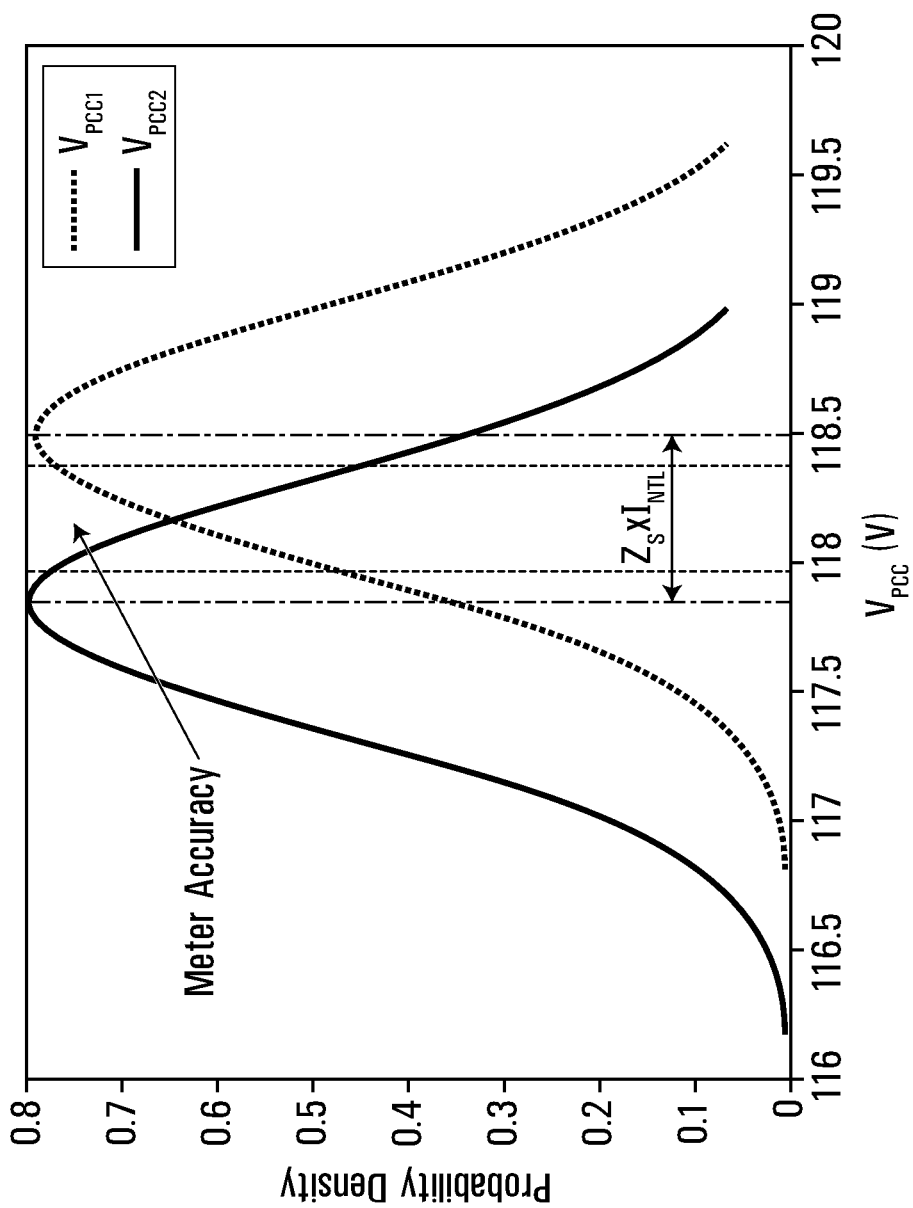
FIG. 5 is a representation of voltage estimates fit to a Gaussian distribution and illustrating voltage fluctuation.

FIG. 4 is an exemplary distribution of voltage estimates $V_{PCC1}$ and $V_{PCC2}$ determined from the first branch 16a and second branch 16b in FIG. 1, respectively; this plot illustrates the range of fluctuations that may occur for each of the voltage estimates. The voltage estimates are shown in FIG. 4 to follow a normal distribution fluctuating between relative minimum and maximum voltages. Accordingly, normalizing voltage estimates using this distribution may offset or minimize the effect of typical fluctuations to help identify a system anomaly. FIG. 5 is an exemplary Gaussian distribution modeling voltage estimates $V_{PCC1}$ and $V_{PCC2}$ in FIG. 1 when an NTL 20 is present in the second branch 16b. The rectangle between the two curves represents an accuracy range of the meter 22b. Due to the overlap between each of the typical distributions for $V_{PCC1}$ and $V_{PCC2}$ in FIG. 5, the presence of an NTL 20 may remain undetected because of the fluctuations experienced in each branch. Therefore, accounting for these fluctuations may help distinguish voltage estimates that actually correspond to a system anomaly or NTL. The curves in FIG. 5 should be sufficiently separated to better distinguish the presence of an NTL in one of the branches 16.

Figure 6:
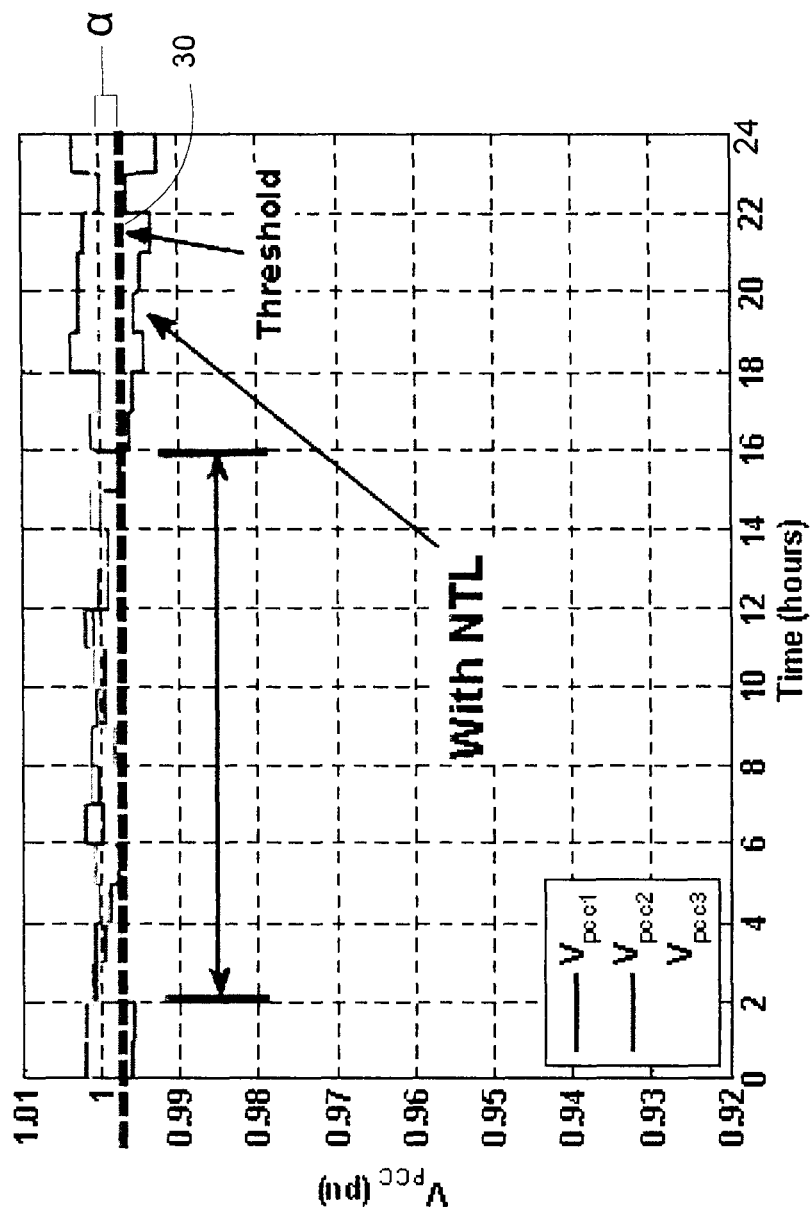
FIG. 6 is an exemplary chart illustrating normalized voltage estimates of a common coupling point performed over time.

FIG. 6 is an exemplary plot illustrating normalized voltage estimates of the common coupling point 14, performed over time using measurements from each of the first branch 16a, second branch 16b, and third branch 16c in FIG. 1. The normalized voltage estimate in an ideal situation should be set to a value of "1". In this embodiment, the detection criterion comprises a threshold 30, which is set to a constant value of "1-α", and indicates an NTL if satisfied. "α" is an input parameter that can be determined through various means described below. As shown in FIG. 6, from about T=2 to 16 hours, the voltage estimates from each of the branches 16 appear relatively similar and oscillate closely around a value of "1". However, from about T=0 to 2, and 16 to 24 hrs, $V_{PCC2}$ diverges from the other normalized voltage estimates, and satisfies the threshold 30 by dropping below it. Accordingly, the plot in FIG. 6 suggests that an NTL may be present in the second branch 16b from the periods of T=0 to 2, and 16 to 24 hrs.

While FIG. 6 shows the detection criterion comprising a constant threshold 30 value of "1-α", in other embodiments, the detection criterion can be determined by other means. For example, α can be set as an error estimation margin, which may account for measurement device accuracies, distribution wire impedance errors, or comprise a self defined tolerance margin. The detection criterion may be satisfied if any of the voltage estimates meet or differ beyond a certain value from the threshold 30; the certain value may be a predetermined value accounting for potential errors or fluctuations in the voltage estimates. The detection criterion, or threshold 30, can also be set as a function of any of the voltage estimates, whether they are instantly obtained, averaged, normalized, or time integrated. When the detection criterion comprises a function of normalized voltage estimates, the criterion may be satisfied if another normalized voltage estimates differs beyond a certain range from the threshold 30; the certain range may be selected to account for potential errors or fluctuations in the normalized voltage estimate. The detection criterion may also be determined according to historical data from previous voltage estimates, such as an average known value where a system anomaly or NTL has been previously identified.

In other embodiments, post data analysis may simply comprise time elapsed confirmation of voltage differences. The analysis may include determining whether a voltage estimate from a certain branch differs from the threshold 30 at a first time (for example, see $V_{PCC2}$ in FIG. 6 at t=18 h), and whether it also differs from the threshold 30 at a second time (see $V_{PCC2}$ at t=20 h). If the voltage estimates differ from the threshold 30 at both times, then the detection criterion is satisfied, and a system anomaly can be confirmed in the corresponding branch to the differing voltage estimates. Accordingly, by determining whether the detection criterion is satisfied depending on the results of the statistical analysis, greater accuracy in the identification and confirmation of a system anomaly can be achieved.

Figure 12:
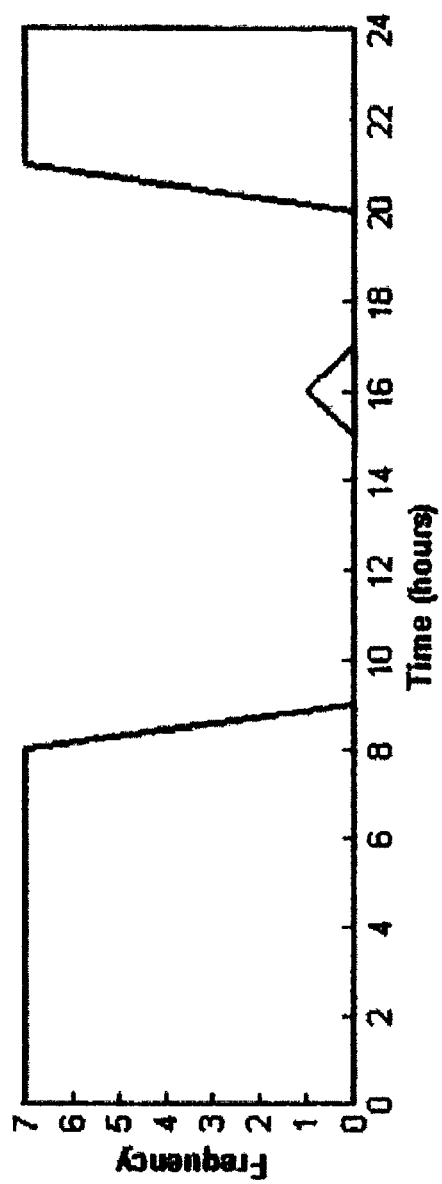
FIG. 12 is a frequency violation chart illustrating an example of post data analysis that may be applied in the method of identifying a system anomaly.

FIG. 12 is an exemplary frequency violation count chart illustrating another embodiment of post data analysis that can be applied. In this embodiment, multiple "samples" of a common coupling point 14 are obtained on an hourly basis, over a 7 day period. For each sample, different voltage estimates of the common coupling point 14 are obtained, and compared to a threshold 30. A violation is found when a sample contains a voltage estimate that satisfies the threshold 30, which increases the violation count for the corresponding hourly interval. A detection criterion comprises a predetermined ratio, and is satisfied if a violation ratio comprising the total violation count to the total number samples taken meets or exceeds the predetermined ratio.

In FIG. 12, the threshold 30 comprises one of the voltage estimates from a respective sample, and is satisfied if another voltage estimate from the same sample differs by a certain value from the threshold 30. As shown in FIG. 12, a total of 7 violations were found in each of the hourly time intervals between T=0-9 hrs, and 20-24 hrs, indicating at least one voltage estimate satisfying the threshold 30 for each sample during those times for the entire week. Also, a single violation was also found at T=16 hrs, indicating that a voltage estimate satisfied the threshold at this time only once during the week. Accordingly, the total number of violations is 92, and the total number of samples taken during the week is 168, resulting in a violation ratio of 54.76%. A detection criterion comprising a predetermined ratio of 50%, for example, would be satisfied in this case, and a system anomaly thereby confirmed. The violation ratio may vary in other embodiments to achieve a desired level of violation confirmation. The detection criterion may alternatively comprise a predetermined violation count, that is satisfied if the number of violations meets or exceed the predetermined violation count. The detection criterion may comprise any number of functions or values sufficient to identify a system anomaly using measured violations or voltage estimates.

In another embodiment, post data analysis may comprise a weighted frequency index that can be calculated to determine if the detection criterion is satisfied. The weighted frequency index can be represented as:

$$F_w = \sum_{t=1}^{24} w(t) \cdot F_{NTL}(t) \tag{10}$$

where $F_{NTL}(t)$ is the frequency of a potential NTL at a particular at time t, and w(t) is the weight given to each frequency of NTL at time t. The weights w(t) can be made proportional to the occurrence of net power loss in the system at a given time. Potential NTLs (determined through comparison of voltage estimates to the detection criterion or threshold, and noting differences, as described above) identified during this same time are likely related to the power loss, and should therefore increase the frequency index to provide a confirming indication of an NTL. However, if a potential NTL or voltage difference is identified at a time where no detected power loss in the system, a lesser weight can be given as this may alternatively be the result of system fluctuations or measurement errors. In this case, the detection criterion may be satisfied if the frequency index reaches a predetermined value for a given time period (typically 24 hours). In other embodiments, measurements from other system devices, such as those in stations, or anywhere along distribution feeders and on distribution transformers, can be incorporated to adjust the weighting of the frequency index to improve NTL detection accuracy.

Components or parameters of the system 10 can also be selected accordingly to further refine the voltage detection method. For example, the typical current or power draw of the NTL may be factors which can effect identification of the NTL using the voltage difference method. These and other parameters can be selected and modified accordingly to further refine the disclosed voltage difference method, in appropriately determining a system anomaly or NTL for a particular power system.

Cascade Configuration

Figure 7:
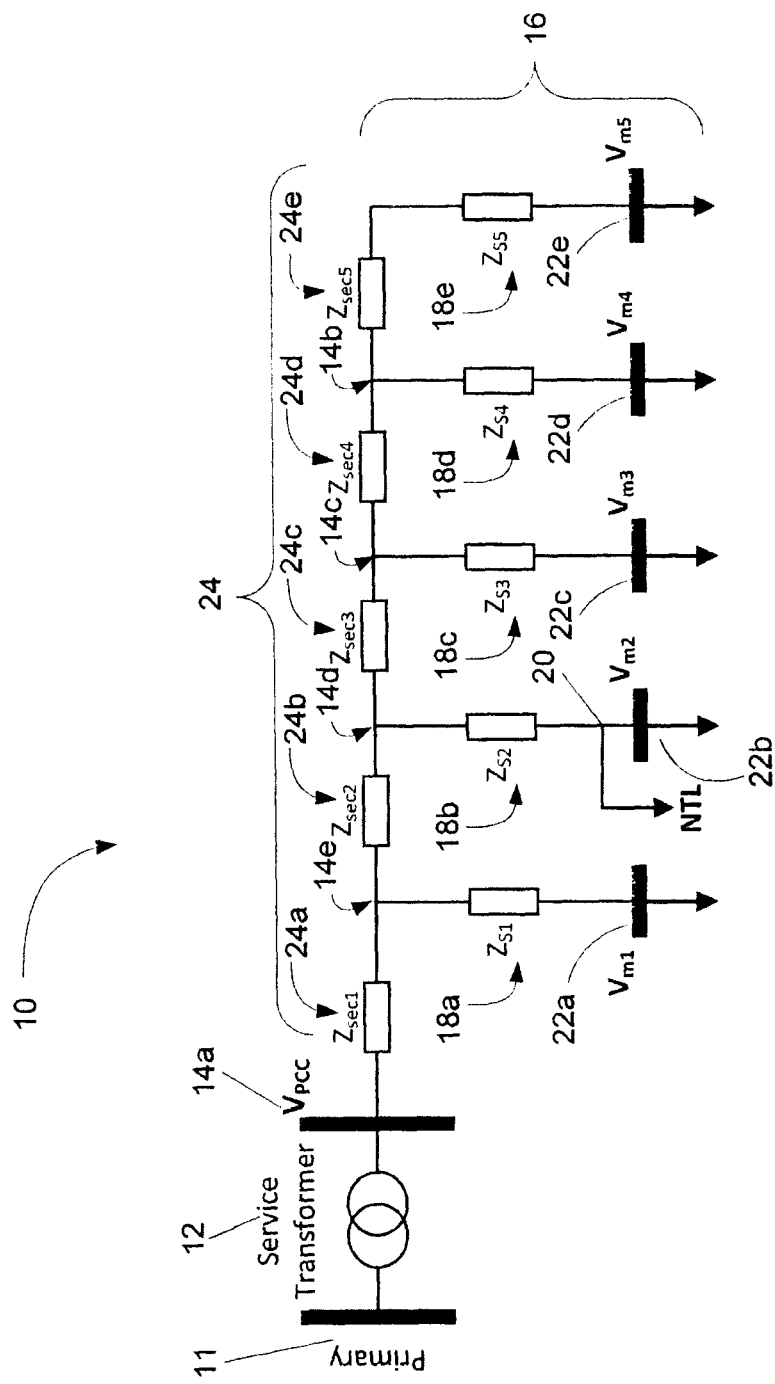
FIG. 7 is an electrical schematic of a power distribution system in a cascade configuration, in which a second embodiment of the method for identifying a system anomaly is applied.

Referring to FIG. 7, there is shown a secondary power distribution system 10 in a cascade configuration in which an embodiment of the disclosed voltage difference method can be applied. The system 10 comprises a service transformer 12 that converts a primary voltage from an input voltage point 11 to a secondary voltage at a common coupling point 14a suitable for distribution to downstream consumers. In this example, a number of branches 16a-e (collectively shown as 16) are coupled to the common coupling point 14a, in which branches 16 are formed by the secondary conductor 24 and service conductors 18a-e (collectively 18) to deliver electricity to individual consumers downstream of each branch. As shown in FIG. 7, the secondary conductor 24 comprises first to fifth secondary segments 24a-e, and each of the service conductors 18 are spaced along the secondary conductor 24 between different secondary segments 24a-e. The first branch 16a comprises first secondary segment 24a, first service conductor 18a, and first meter 22a. The second branch 16b comprises first to second secondary segments 24a-b, second service conductor 18b, and second meter 22b. The third branch 16c comprises first to third secondary segments 24a-c, third service conductor 18c, and third meter 22c. The fourth branch 16d comprises first to fourth secondary segments 24a-d, fourth service conductor 18d, and fourth meter 22d. The fifth branch 16e comprises first to fifth secondary segments 24a-e, fifth service conductor 18e, and fifth meter 22e. Accordingly, the branches 16 share portions of the secondary conductor 24, and diverge along different secondary segments 24a-e of the secondary conductor 24, wherein each branch 16a-e comprises a respective meter 22a-e for determining electrical measurements of the branch. An exemplary system anomaly is shown as NTL 20 located above meter 22b in the second branch 16b.

The secondary conductor 24 can comprise the impedance of the distribution wire transmitting electricity from the common coupling point 14a to the service conductors 18, with the secondary segments 24a-e comprising the specific impedances of the wire between each coupling point 14a-e. Each service conductor 18a-e can be modeled according to the resistivity and length of the distribution wire, or other physical impedances between coupling points 14b-e and a respective meter 22a-e. Each meter 22a-e is used to measure electrical properties of its branch 16a-e, such as voltage, current, power, and energy, to monitor and record electrical consumption of a downstream consumer for billing and payment purposes.

The voltage difference method can be applied to the cascade configuration of FIG. 7 analogously to how it is implemented for the parallel configuration of FIG. 1, with the exception that the voltage estimates from each branch 16a-e also include the sum of voltage drops across the secondary segments 24a-e between each service conductor 18a-e and the common coupling point 14a. After obtaining measurements from the meters 22, voltage estimates for the common coupling point 14a from each of the downstream branches 16 can be determined as follows:

$$V_{PCC1} = V_{m1} + Z_{S1} \cdot I_1 + Z_{Sec1} \cdot I_T \quad (11)$$

$$V_{PCC2} = V_{m2} + Z_{S2} \cdot I_2 + Z_{Sec1} \cdot I_T + Z_{Sec2}(I_T - I_1) \quad (12)$$

$$V_{PCC3} = V_{m3} + Z_{S3} \cdot I_3 + Z_{Sec1} \cdot I_T + Z_{Sec2}(I_T - I_1) + Z_{Sec3}(I_T - I_1 - I_2) \quad (13)$$

$$V_{PCC4} = V_{m4} + Z_{S4} \cdot I_4 + Z_{Sec1} \cdot I_T + Z_{Sec2}(I_T - I_1) + Z_{Sec3}(I_T - I_1 - I_2) + Z_{Sec4}(I_4 + I_5) \quad (14)$$

$$V_{PCC5} = V_{m5} + (Z_{S5} + Z_{Sec5}) \cdot I_5 + Z_{Sec1} \cdot I_T + Z_{Sec2}(I_T - I_1) + Z_{Sec3}(I_T - I_1 - I_2) + Z_{Sec4}(I_4 + I_5) \quad (15)$$

$$I_T = I_1 + I_2 + I_3 + I_4 + I_5 \quad (16)$$

where $V_{m1}$, $V_{m2}$, $V_{m3}$, $V_{m4}$, and $V_{m5}$, and $I_1$, $I_2$, $I_3$, $I_4$, and $I_5$, are respective voltage and current measurements from meters 22a-e in each of the first to fifth branches 16a-e, $Zs_{ec1}$, $Zs_{ec2}$, $Zs_{ec3}$, $Zs_{ec4}$, and $Zs_{ec5}$ are the impedances of secondary segments 24a-e between the service conductors 18a-e, and $I_T$ represents the total estimated current in the system equal to $I_1+I_2+I_3+I_4+I_5$, comprising the sum of the measured current values in each meter 22a-e.

Upon applying equations (11)-(16) above, voltage estimates for the common coupling point 14a derived from each branch 16a-e, can be determined and analyzed in the same manner as described for FIG. 1. An NTL is identified if any of the voltage estimates satisfies a detection criterion. As described above, the detection criterion may comprise a threshold that is a voltage estimate from one of the branches 16, and may be satisfied if another voltage estimate substantially differs from the threshold. If satisfied, the NTL will generally correspond to a branch 16a-e having one of the lower, or the lowest relative voltage estimates for the common coupling point 14a. In other embodiments, the detection criterion may be set as a function of any of the voltage estimates, or it may be determined according to historical data from previous voltage estimates, such as an average known value where an NTL has been identified.

While the above example illustrates the use of uppermost coupling point 14a as the common coupling point for determining voltage estimates, it is important to note that any of coupling points 14a-e in FIG. 7 may be used as the common coupling point to search for and identify a downstream system anomaly or NTL. For example, coupling point 14b can be used as the common coupling point to identify a downstream NTL in the rightmost branch (secondary segment 24e, service conductor 18e, and meter 22e) and adjacent branch (service conductor 18d and meter 22d).

In another example, coupling point 14c can instead be used as the common coupling point to identify a downstream NTL in a rightmost branch (secondary segments 24d-e, service conductor 18e, and meter 22e), a middle branch (secondary segment 24d, service conductor 18d and meter 22d), and a lower branch (service conductor 18c and meter 22c). Accordingly, any of coupling points 14a-e can be used as the common coupling point for identifying downstream system anomalies or NTLs. While the use of a relatively upstream coupling point (for example 14a) as the common coupling point provides a broader search through a greater number of branches, use of a relatively downstream coupling point (for example 14c) can simplify calculations and provide for quicker results for when searching a more limited number of branches. Furthermore, in alternative embodiments (not shown), voltage estimates between coupling points 14a-e can be used along with meter 22 measurements to also help determine the presence of an NTL along the secondary conductor 24.

Mixed Configuration

Figure 8:
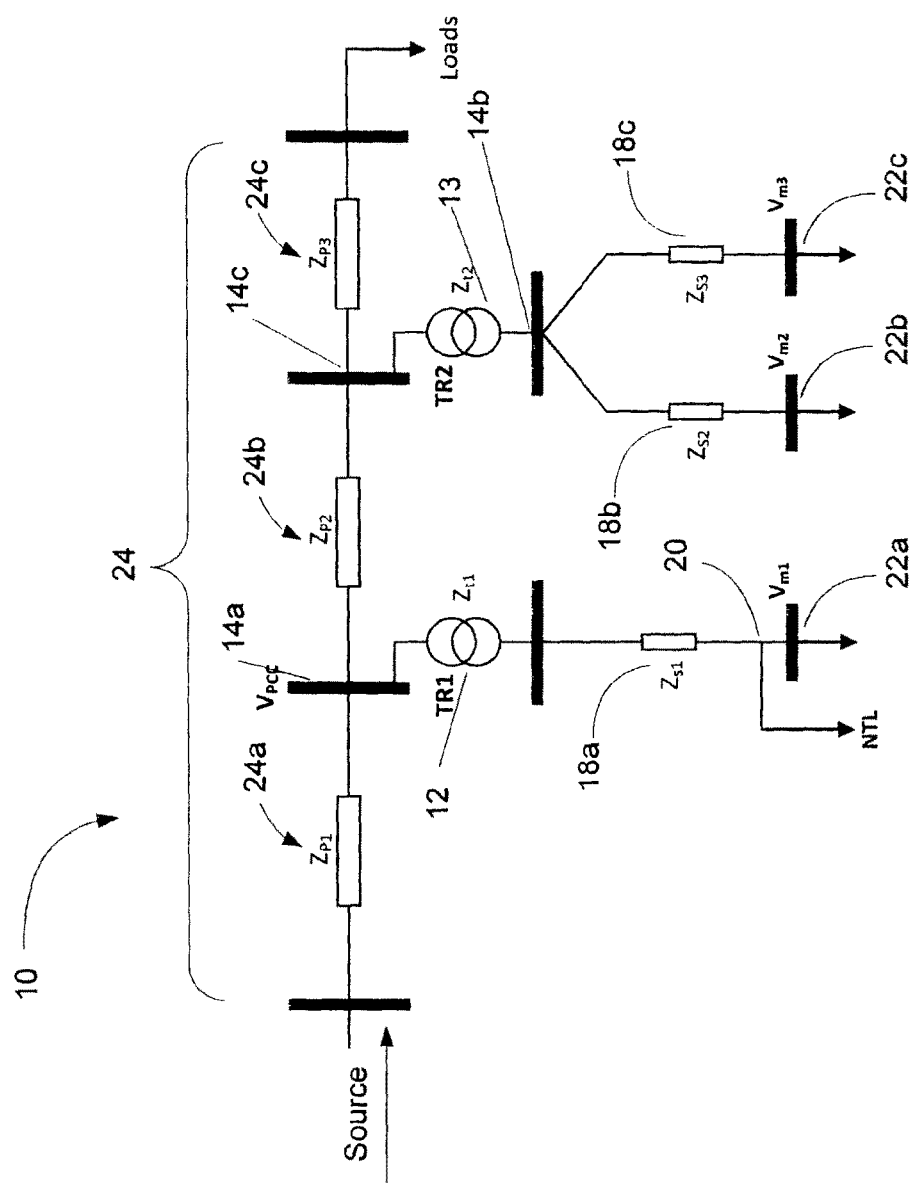
FIG. 8 is an electrical schematic of a power distribution system in a single load configuration, in which a third embodiment of the method for identifying a system anomaly is applied.

Referring to FIG. 8 is a mixed configuration power distribution system 10 in which an embodiment of the disclosed voltage difference method can be applied. The system 10 comprises a primary conductor 24 divided into primary segments 24a-c, which transmits electricity at a primary voltage from a supply source across the primary segments 24a-c. A single load transformer 12 is coupled to a common coupling point 14a along the primary conductor 24 in between the first and second primary segments 24a-b. A double load transformer 13 is coupled to the primary conductor 24 at point 14c in between the second and third primary segments 24b-c. The single and double load transformers 12, 13 convert primary transmission voltages along the primary conductor 24 to output voltages suitable for localized power distribution through different branches 16a-c (not shown, but collectively 16) and to customers. In this example, with 14a as the common coupling point, the first branch 16a comprises single load transformer 12, service conductor 18a, and meter 22a. The second branch 16b comprises primary segment 24b, double load transformer 13, service conductor 18b, and meter 22b. The third branch 16c comprises primary segment 24b, double load transformer 13, service conductor 18c, and meter 22c. As shown in FIG. 8, the second and third service conductors 18b-c are coupled in parallel to the double load transformer 13. Also, each branch 16a-c comprises a respective meter 22a-c, service conductors 18a-c, transformer 12-13, and possibly primary segments 24b upstream of the respective meter 22a-c and between the common coupling point 14a.

The voltage difference method can be applied to the mixed configuration of FIG. 8 in an analogous way as the cascade configuration of FIG. 7. In contrast to the cascade configuration however, the voltage estimates further include a voltage drop across one of the single and double load transformers (12, 13). After obtaining measurements from the meters 22 of each of the branches 16a-c, voltage estimates of the common coupling point 14a can be derived from each branch as follows:

$$V_{PCC1} = V_{m1} + (Z_{S1} + Z_{t1}) \cdot I_1 \quad (17)$$

$$V_{PCC2} = V_{m2} + Z_{S2} \cdot I_2 + Z_{t2}(I_2 + I_3) + Z_{p2}(I_2 + I_3 + I_{Loads}) \quad (18)$$

$$V_{PCC3} = V_{m3} + Z_{S3} \cdot I_3 + Z_{t2}(I_2 + I_3) + Z_{p2}(I_2 + I_3 + I_{Loads}) \quad (19)$$

where $V_{m1}$, $V_{m2}$, and $V_{m3}$, and $I_1$, $I_2$, and $I_3$, are respective voltage and current measurements from meters 22a-c in each of the first to third branches 16a-c, $Z_{t1}$, and $Z_{t2}$ are the impedances of the single and double load transformers (12, 13), $Z_{p2}$ is the impedance of primary segment 24b, and $I_{Loads}$ represents the current flowing to other loads in the system, which can be provided by any measurement device installed at that location or estimated through system analysis.

After obtaining voltage estimates for the common coupling point 14a using measurements from each meter 22 and applying equations (17)-(19) above, the voltage estimates can be analyzed in the same manner as described for FIG. 7. A system anomaly is represented by NTL 20 in the first branch 16a, and can be identified if any of the voltage estimates satisfies a detection criterion.

While FIG. 8 shows the common coupling point 14a in between the first and second primary segments 24a-b, in other embodiments, the common coupling point can be located anywhere along the primary conductor 24 so long as it is upstream of the meters 22a-c used in determining the voltage estimates from the branches 16a-c. For example, coupling point 14c may be used as the common coupling point to determine any downstream NTL in a first branch (transformer 13, service conductor 18b, and meter 22b) and a second branch (transformer 13, service conductor 18c, and meter 22c). Additionally, if only secondary side analysis is required, coupling point 14b can also be used to determine any downstream NTLs in a first branch (service conductor 18b, and meter 22b) and a second branch (service conductor 18c, and meter 22c). The equations used to determine the voltage estimates for each branch 16 may also be revised in other embodiments to account for voltage drops across any additional components upstream of the meters 22 and downstream of the selected common coupling point 14a-c.

Successive Bottom-Up Voltage Analysis

While several of the foregoing examples illustrate the voltage difference method applied to detect a system anomaly on the secondary side of power distribution system (i.e. downstream of any secondary transformers), the voltage difference method can also be applied to detect a system anomaly on the primary side of the power distribution system (hereinafter "distribution feeder"), upstream of any secondary transformers.

Figure 9:
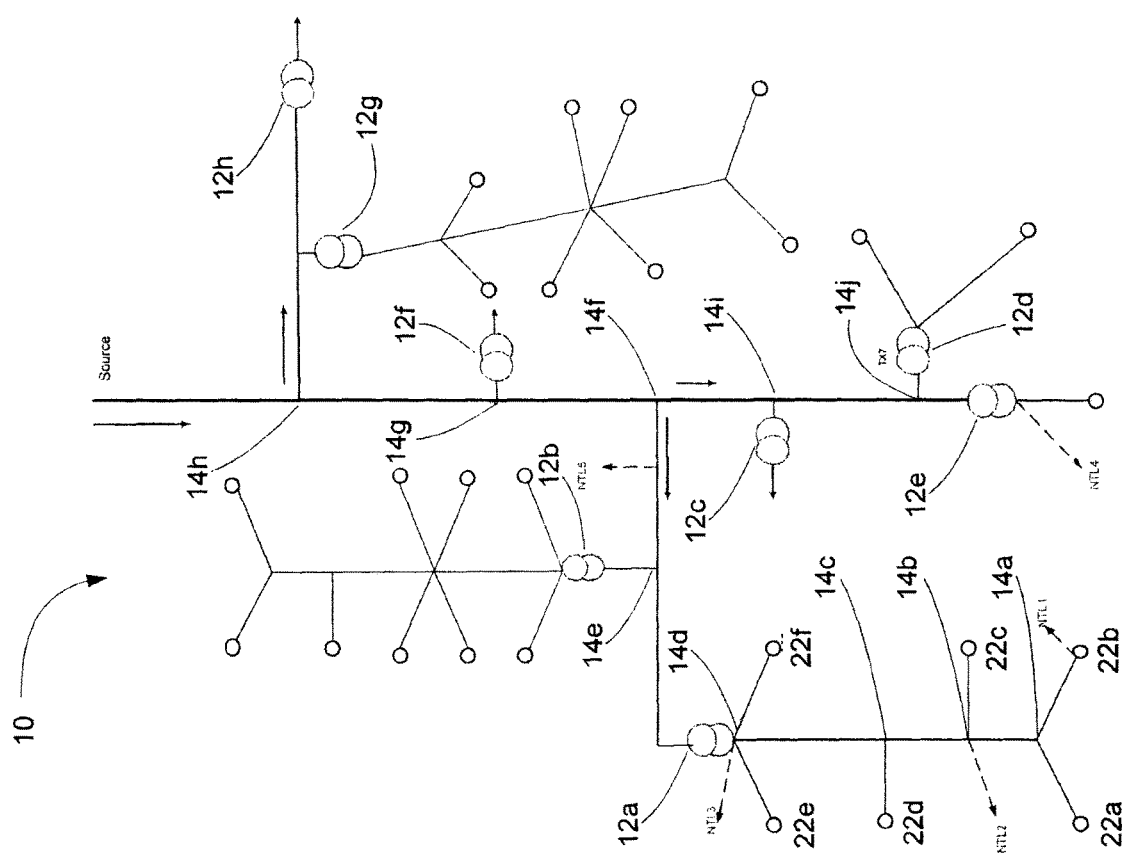
FIG. 9 is an electrical schematic of a power distribution system illustrating various coupling points that may be selected as the common coupling point, for application of the method to identify a system anomaly.

FIG. 9 is an exemplary schematic of a power distribution system 10 illustrating the potential selection of any of coupling points 14a-j along either the distribution feeder or the secondary side of the system 10, as the common coupling point for application of the voltage difference method. As shown in FIG. 9, the system 10 comprises a radial topology commonly analogized as a "tree", wherein the distribution feeder primary line extends between coupling points 14e-j for transmitting electricity at a primary voltage to transformers 12a-h, which then converts the primary voltage into a secondary voltage for distributing electricity to downstream branches of individual consumers. Meters 22a-f are located in different branches to measure record each consumer's electrical consumption for billing and payment purposes, and also provide electrical characteristics of the branch useful for the voltage difference method. System anomalies are represented by various NTLs (NTL1, NTL2, NTL3, NTL4, and NTL5) in this example.

With reference to FIG. 9, the voltage difference method may begin on a relatively downstream coupling point, and then be successively applied to more upstream coupling points to uncover various NTLs throughout different levels of the system 10. For example, coupling point 14a can be first selected as the common coupling point to identify NTL1 using electrical measurements from meters 22a-b; however, the voltage difference method would fail to identify upstream NTL2 when using coupling point 14a as the common coupling point. Similarly, using coupling point 14b as the common coupling point would also fail to recognize NTL2 as they are coincident. Accordingly, coupling point 14c, which is upstream of 14b and NTL2, can then be selected as the common coupling point so that NTL2 can be identified, along with any other NTLs downstream from coupling point 14c. In the same way, coupling point 14d can then be selected to identify any potential downstream NTLs in the branches corresponding to meters 22a-f, including potential NTLs along the secondary distribution line between coupling points 14a-d.

In some embodiments, successive upstream application of the voltage difference method can be simplified by determining voltage and current values at particular coupling points, and then using these values when reapplying the voltage difference method to a more upstream coupling point. For example, a voltage estimate for coupling point 14b determined using meters 22a-c and not corresponding to a system anomaly may be used to represent the voltage at coupling point 14b. The current flowing through coupling point 14b can then be determined according to the sum of current values measured at downstream meters 22a-b and an estimated current for NTL1. Since the voltage and current at coupling point 14b is now estimated, these values may now be used in a subsequent application of the voltage difference method for an upstream coupling point; in this way coupling point 14b can now be treated similar to a meter in a successive level of voltage analysis. The voltage difference method may now be reapplied at coupling point 14c, for example, using the voltage and current values obtained for downstream coupling point 14b, along with measurements from meter 22d to determine any NTLs downstream of coupling point 14c and upstream of both meter 22d and coupling point 14b (which in this case is NTL2). This procedure may be successively applied throughout different levels of the entire power system 10 in order to identify and locate various system anomalies along the distribution line.

The voltage difference method may also be applied onto the distribution feeder of the system 10 in order to identify any potential NTLs along primary distribution lines. Continuing with the example above and moving upstream onto the distribution feeder, coupling point 14e may be selected as the common coupling point to identify NTL3 below transformer 12a at coupling point 14d, along with NTL1 and NTL2 in other downstream branches. Coupling point 14j may be selected as the common coupling point to identify downstream NTL4. Finally, any of coupling point 14f-h can be selected as the common coupling point to identify any of NTL1-4 downstream of the common coupling point. Accordingly, any coupling point along system 10, whether on the secondary side or along the distribution feeder, can be selected as the common coupling point for application of the voltage difference method. Successive bottom-up application of the voltage difference method allows the entire system 10 to be readily inspected for identifying and locating various system anomalies or NTLs throughout the system 10.

Topology Error Detection

While the foregoing examples illustrate how the voltage difference method may be applied to identify NTLs in power systems, in other embodiments, the method is also able to identify power system topology errors, including erroneous characterization of parameter values of components in the power system. A topology error may be caused by a number of factors, including: incorrect connection of branches or meters to coupling points or service transformers, incorrect connection of service transformers to distribution feeder phase lines, and incorrect modeling of transformer sizes and service wire lengths. Any of these discrepancies may be identified through the disclosed voltage difference method, as will be highlighted below.

Figure 10:
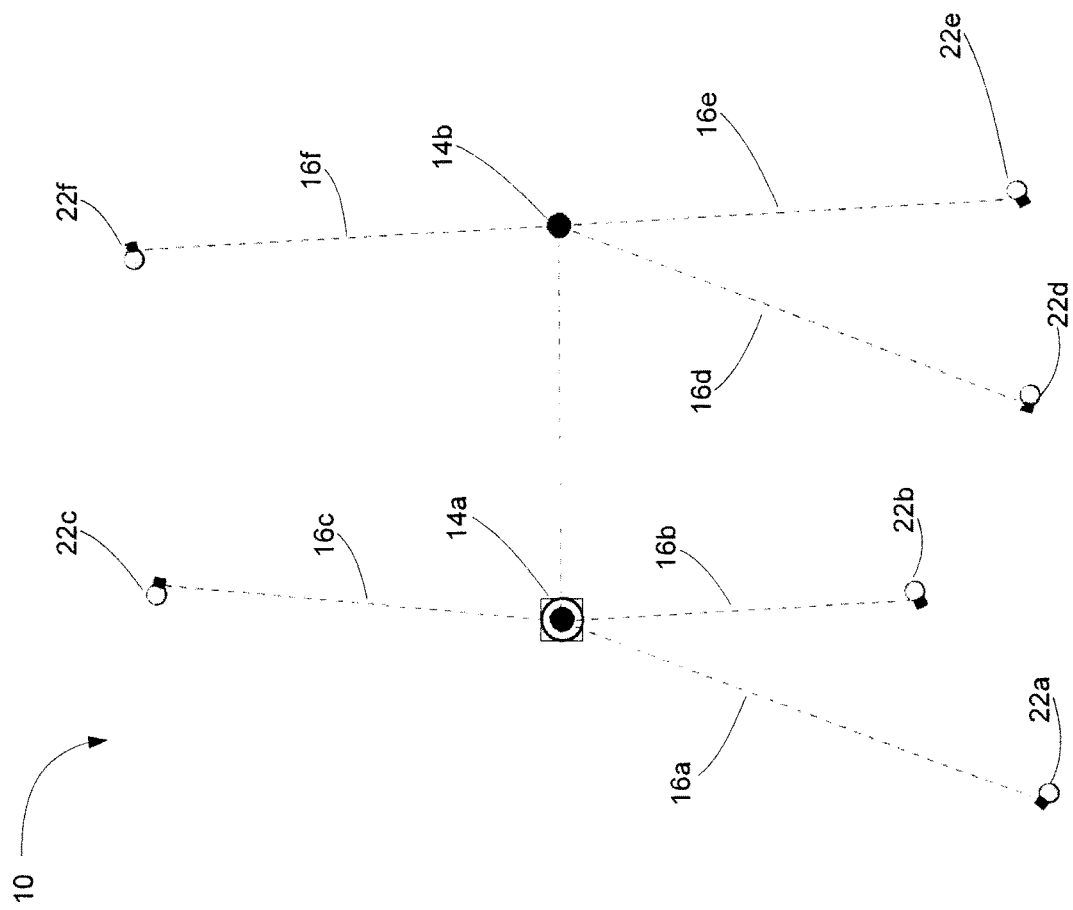
FIG. 10 is an exemplary schematic of a power distribution system installed in the field, which illustrates the method of identifying a system anomaly applied to identify a topology error.

Referring to FIG. 10, there is shown an exemplary schematic of a power distribution system 10 as installed in the field, comprising upstream coupling point 14a coupled to branches 16a-c and having respective meters 22a-c, and downstream coupling point 14b coupled to branches 16d-f having respective meters 22d-f, as shown. In this example, the schematic represents the actual physical implementation of the system 10 within the field.

Figure 11:
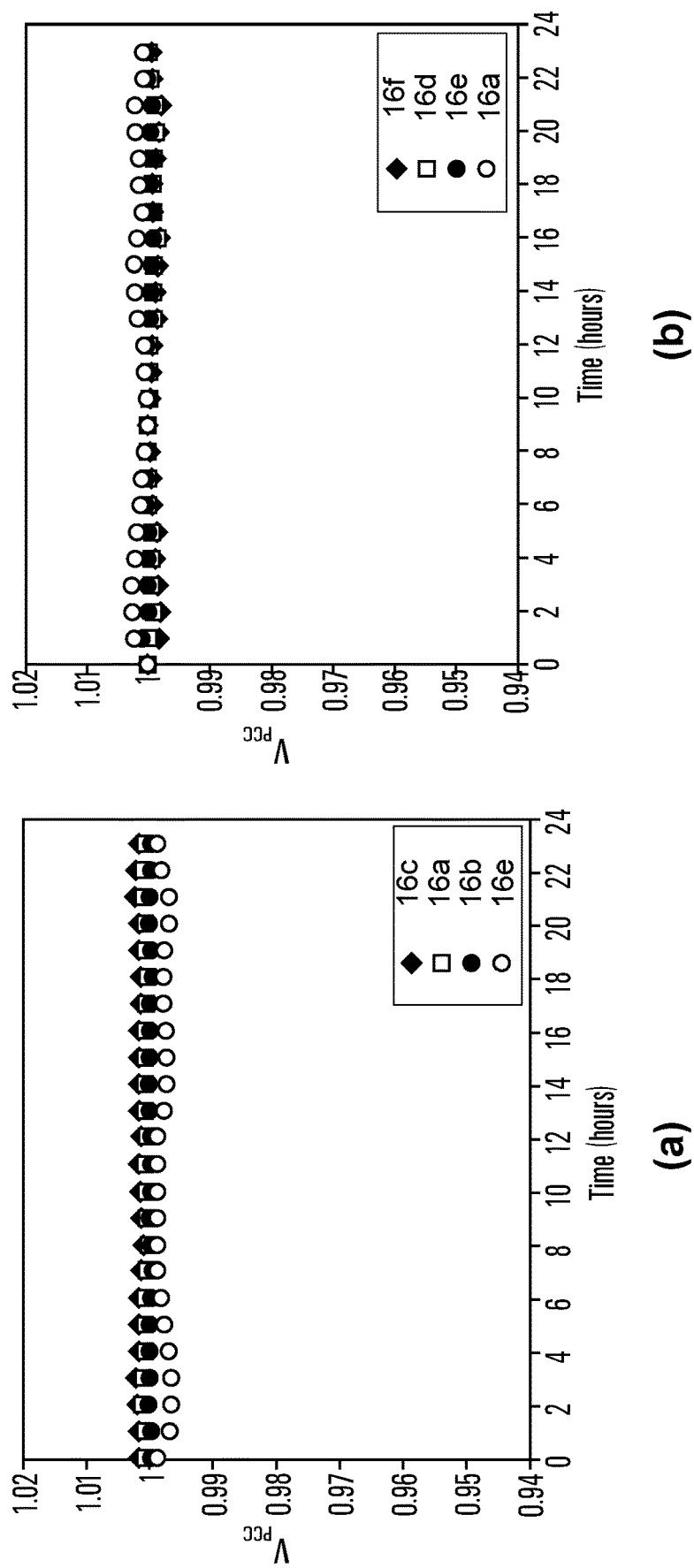
FIG. 11 is an exemplary chart illustrating voltage estimates for the common coupling points in FIG. 10.

However, due to installation errors, data entry errors, or tampering, the field implementation of the system 10 shown in FIG. 10 may not match the system topology stored on record at a power company's Geographical Information System (GIS) or asset management information systems. For example, the GIS records may alternatively show that branch 16e having meter 22e is coupled to upstream coupling point 14a, instead of being coupled to downstream coupling point 14b in the field and as shown in FIG. 10. In this case, when voltage estimates of the upstream coupling point 14a as the common coupling point are determined, the voltage estimate corresponding to branch 16e will be generally lower than those for other coupled branches 16a-c (see FIG. 11(a), for example). This may indicate to a power company that branch 16e has the wrong mapping in their topology records, and that branch 16e may actually be coupled to a more downstream coupling point in the field.

In another example, the GIS records may alternatively show branch 16a having meter 22a coupled to downstream coupling point 14b, instead of being coupled to upstream coupling point 14a in the field and as shown in FIG. 10. In this case, when voltage estimates of the downstream coupling point 14b as the common coupling point are determined, the voltage estimate corresponding to branch 16a will be generally higher than those for other coupled branches 16d-e (see FIG. 11(b), for example). This may also indicate to a power company that branch 16a has the wrong mapping in their topology records, and that branch 16a may actually be coupled to a more upstream coupling point in the field. Accordingly, by comparing voltage estimates from different branches coupled to a common coupling point, a power company may identify branches that are erroneously mapped in their topology records, or coupled to incorrect coupling points in the field, as these will result in voltage estimates that differ from other commonly coupled branches in a power company's topology records.

In the above embodiments, the detection criterion comprises a threshold that is a voltage estimate from a branch correctly coupled to the common coupling point. The detection criterion may be satisfied if any voltage estimate sufficiently differs from the threshold, which in this case, identifies a topology error associated with the branch having the different voltage estimate. In other embodiments however, the detection criterion may be set according to any of the other previously described methods. Post data analysis may also be applied, such as violation frequency count over a period of time, with the detection criterion appropriately selected according to the type of post data analysis applied.

Moreover, the voltage difference method may also be used to identify erroneous component parameter values in the field or in a power company's GIS records. Still referring to FIG. 10, a power company's records may indicate that branches 16a-c comprise a service conductors (not shown) having impedances $Z_a$, $Z_b$, $Z_c$ in series with meters 22a-c, respectively. The meters 22a-c may provide electrical measurements of voltages $V_{ma}$, $V_{mb}$, $V_{mc}$ and currents $I_a$, $I_b$, $I_c$, respectively, from which voltage estimates for coupling point 14a can be derived from each branch as:

$$V_{PCCa} = V_{ma} + Z_a \cdot I_a \qquad (20)$$

$$V_{PCCb} = V_{mb} + Z_b \cdot I_b \qquad (21)$$

$$V_{PCCc} = V_{mc} + Z_c \cdot I_c \qquad (22)$$

Assuming ideal circumstances (i.e. no fluctuations, electrical parameter errors, measurement errors, or NTL losses), voltage estimates derived from all three branches should be the same if the presumed impedances $Z_a$, $Z_b$, and $Z_c$ are accurate. However, an error in any one of the presumed impedances $Z_a$, $Z_b$, and $Z_c$ will result in a discrepancy in the voltage drop across the impedance, and provide for a different voltage estimate (either higher or lower) for the common coupling point 14a when compared to the other voltage estimates. Accordingly, differences in voltage estimates for a common coupling point may also reveal an incorrect component parameter value in the field or on record with a power company. Once alerted to a potentially incorrect parameter value, power companies can perform further investigation and either provide components with the correct the parameter value in the field, or update their internal topology and parameter records accordingly.

Topology Mapping

The voltage difference method may also be applied to map out and reconstruct distribution system network topology records through voltage profile analysis. Voltage profile analysis may be used to determine correct mappings for branches that have been identified as having an incorrect branch connection. By maintaining updated and accurate topology records, power companies can more efficiently manage power system operations and electricity distribution to customers.

Figure 13:
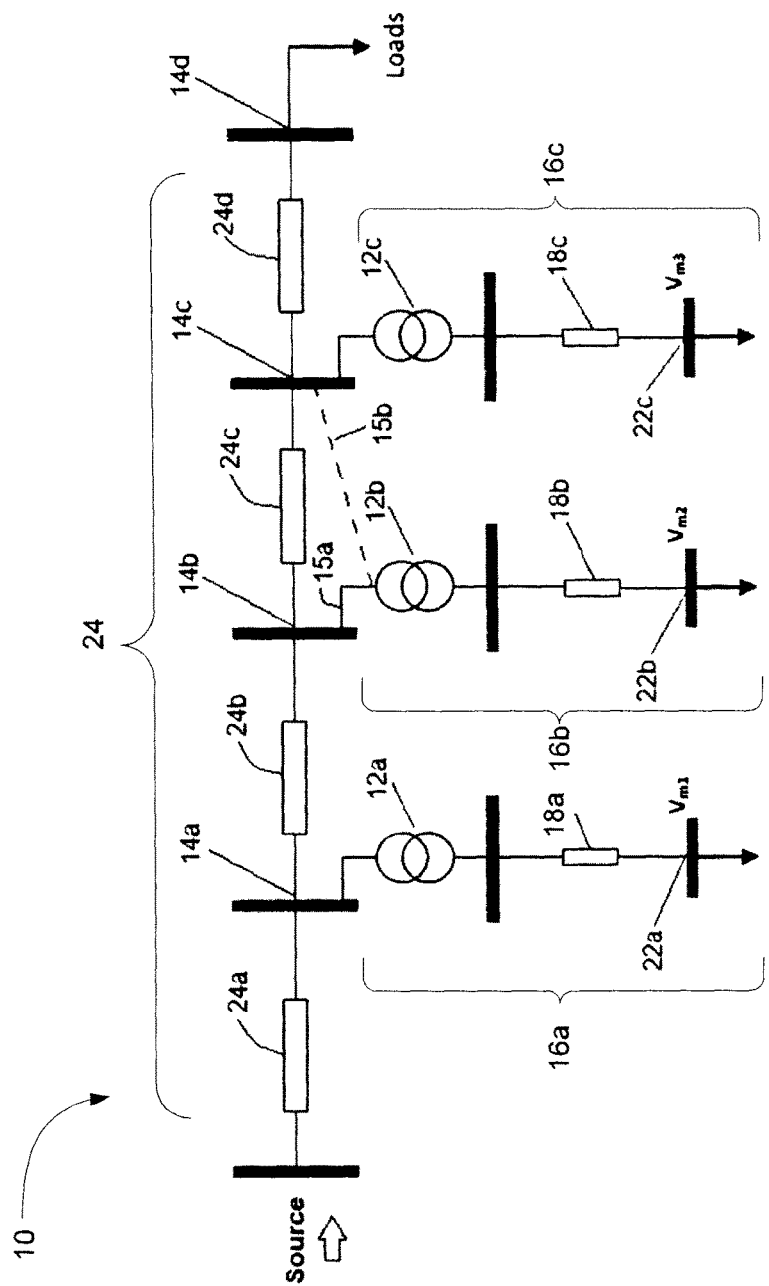
FIG. 13 is an electrical schematic of a power distribution system illustrating an embodiment of the method for identifying a system anomaly in which voltage profile analysis is applied for mapping an incorrect branch connection to reconstruct the power distribution system topology.

FIG. 13 is an electrical schematic of a power system 10 illustrating an embodiment of the voltage difference method using voltage profile analysis for mapping an incorrect branch connection to correct topology records. As shown in FIG. 13, the system 10 comprises a primary conductor 24 divided into primary segments 24a-d, which transmits electricity at a primary voltage from a supply source across primary segments 24a-d. A first branch 16a comprises transformer 12a, service conductor 18a, and meter 22a, and is coupled along the primary conductor 24 at coupling point 14a. A second branch 16b comprises transformer 12b, service conductor 18b, and meter 22b. A third branch 16c comprises transformer 12c, service conductor 18c, and meter 22c, and is coupled along the primary conductor 24 at coupling point 14c.

In this embodiment, a power company's topology records may show the second branch 16b being coupled to coupling point 14c via connection 15b (shown as a dashed line). However, the second branch 16b may actually be coupled to coupling point 14b in the field through connection 15a (shown as a solid line). Accordingly, a topology error corresponds to branch 16b, which means that branch 16b is physically connected to a different coupling point in the field than that shown in a power company's topology records. This topology error may be identified through application of the voltage difference method as described above, and may also be confirmed through successive bottom up voltage analysis using any of nearby coupling points 14a-d. Once branch 16b has been identified as having the incorrect connection and hence the source of the topology error, voltage profile analysis can be performed to determine which coupling point branch 16*b* is actually connected to in the field.

Figure 14:
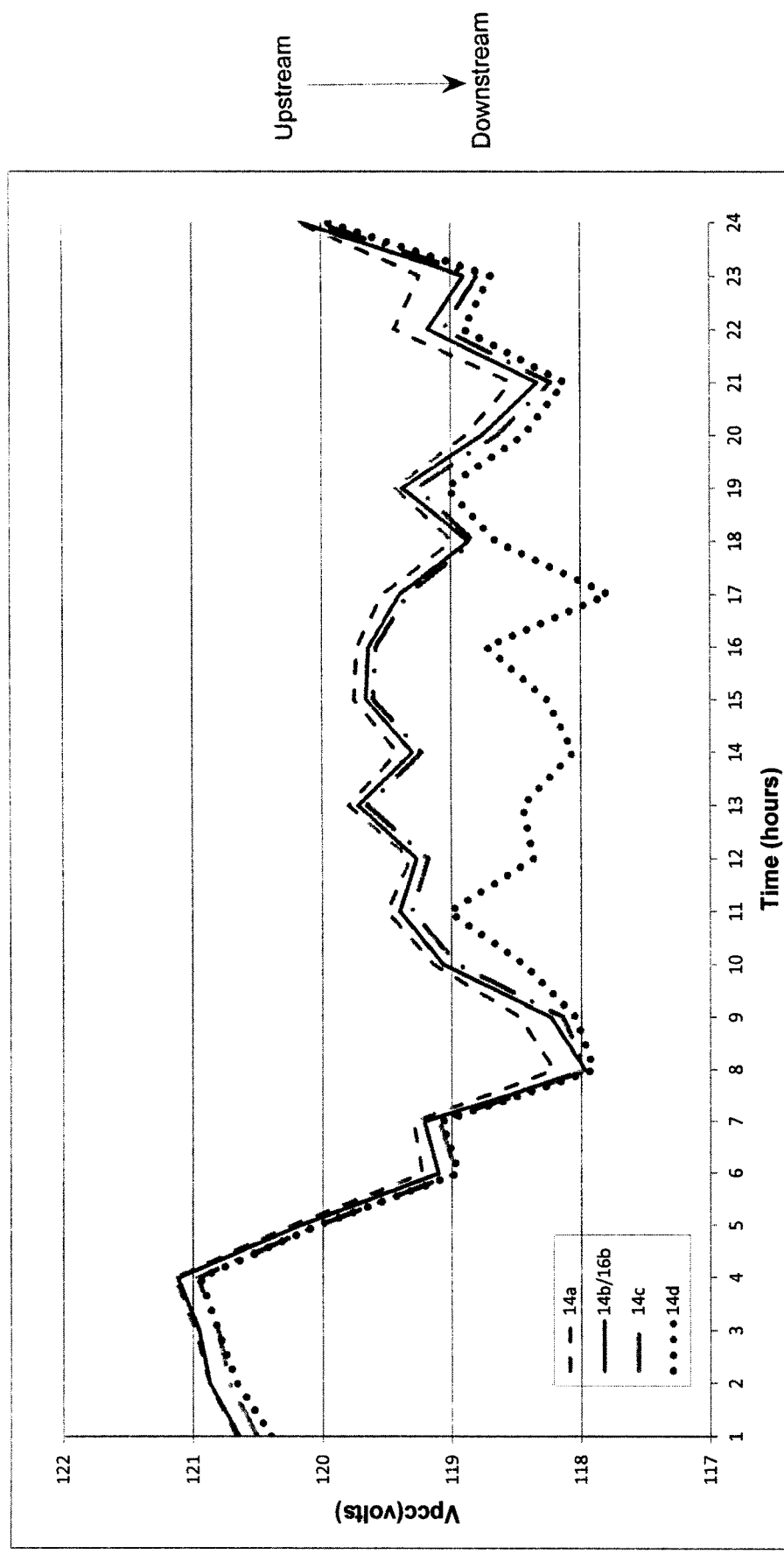
FIG. 14 is an exemplary voltage profile chart of the power distribution system in FIG. 13, illustrating voltage profiles of various coupling points.

FIG. 14 is an embodiment of a voltage profile chart that can be used for voltage profile analysis. This chart includes voltage profile information obtained over time across branch 16*b*, and for coupling points 14*a-d* of FIG. 13. While the voltage profiles obtained for coupling points 14*a-d* will tend to have similar profile shapes, as they are all obtained along the same primary conductor 24, they will also tend to have different voltage offset levels (or biasing levels) because of the discrete voltage drops along the different primary segments 24*a-d* between coupling points 14*a-d*. Accordingly, downstream coupling points will typically have a voltage profile similarly shaped but biased below that of more upstream coupling points, as shown in FIG. 14. However, slight differences between the voltage profile shapes may result due to different load compositions at each coupling point, or the presence of an NTL at certain times (as shown in the voltage profile of coupling point 14*d*, for example). The voltage profile across branch 16*b* can be estimated by using electrical measurements from meter 22*b*, and applying Ohm's law as described above, to estimate the voltage at the top of branch 16*b*. Voltage profiles for coupling points 14*a-d* may be determined by obtaining voltage estimates in the same way described above, but omitting any voltage estimates that correspond to the identified topology error (which in this embodiment corresponds to branch 16*b* and meter 22*b*). Once sufficient voltage profile information has been obtained, voltage profile analysis can be performed through comparison of the voltage profile for branch 16*b* and the voltage profiles for coupling points 14*a-d*.

By comparing the voltage profile of branch 16*b* to the voltage profiles of coupling points 14*a-d*, a determination can be made as to the actual topology between branch 16*b* and coupling points 14*a-d*. For example, voltage profile analysis may show the voltage profile for branch 16*b* substantially matching the voltage profile of a certain coupling point, which suggests that branch 16*b* is likely connected to that certain coupling point to thereby result in the matching voltage profiles. In this embodiment, the voltage profile for branch 16*b* matches the voltage profile for coupling point 14*b*, thereby indicating that branch 16*b* is connected to coupling point 14*b* to result in the matching voltage profiles. Alternatively, voltage profile analysis may show the voltage profile for branch 16*b* fitting substantially in between the voltage profiles of two non-adjacent coupling points (because of the discrete voltage level drops across primary segments 24*a-d* discussed above), which suggests that branch 16*b* is likely connected to a coupling point in between the two non-adjacent coupling points to produce this result. In this embodiment, the voltage profile for branch 16*b* also fits in between the voltage profiles for coupling points 14*a* and 14*c*, thereby indicating that branch 16*b* is coupled to coupling point 14*b* for this result to occur. Accordingly, by performing voltage profile analysis as described above, the correct mapping between branches corresponding to topology errors and other coupling points can be ascertained. For the above embodiment, topology records may be updated to remove the erroneous connection 15*b* shown in FIG. 13 and replace it with connection 15*a* showing that branch 16*b* is coupled to coupling point 14*b* in the field.

Figure 15:
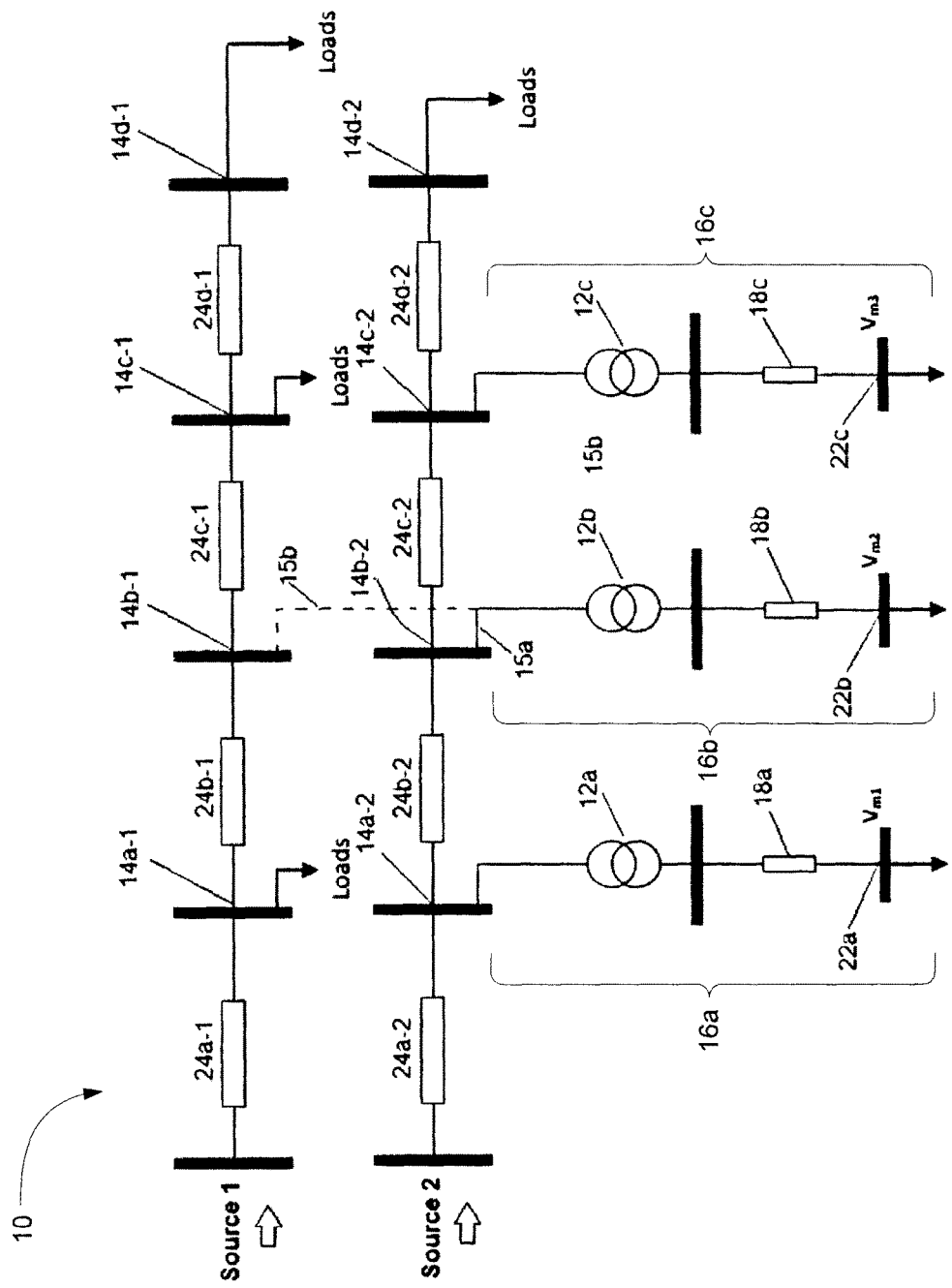
FIG. 15 is an electrical schematic of a multi-phase power distribution system in which voltage profile analysis is applied for mapping an incorrect branch connection to a different feeder phase line to reconstruct the topology of the power distribution system.

In addition to mapping branches to appropriate coupling points in a single phase power system, the voltage difference method may also be applied to map branches coupled to an incorrect distribution feeder phase line (hereinafter "feeder phase line") in multi phase power systems. FIG. 15 is an electrical schematic illustrating an embodiment of the voltage difference method applied to reconstruct a topology hierarchy in a multi phase power system 10. As shown in FIG. 15, the system 10 comprises a first feeder phase line comprising first primary segments 24*a*-1 to 24*d*-1, which transmits electricity from a first supply source and having a first phase across the first primary segments 24*a*-1 to 24*d*-1. A second feeder phase line is divided into second primary segments 24*a*-2 to 24*d*-2, which transmits electricity from a second supply source and having a second phase across the second primary segments 24*a*-2 to 24*d*-2. A first branch 16*a* comprises transformer 12*a*, service conductor 18*a*, and meter 22*a*, and is coupled along the second primary conductor at coupling point 14*a*-2. A second branch 16*b* comprises transformer 12*b*, service conductor 18*b*, and meter 22*b*. A third branch 16*c* comprises transformer 12*c*, service conductor 18*c*, and meter 22*c*, and is coupled along the second primary conductor at coupling point 14*c*-2. Electricity from the two feeder phase lines may be derived from the same feeder source, or two different feeder sources. Due to the phase voltage imbalances and different load compositions of the two feeder phase lines, electricity from the first feeder phase line will have a slightly different voltage amplitude than electricity from the second feeder phase line, and the voltage variation shape from the first phase line will be different than that of the second phase line.

In this embodiment, a power company's topology records may show the second branch 16*b* being coupled to coupling point 14*b*-1 of the first feeder phase line via connection 15*b* (shown as a dashed line). However, the second branch 16*b* may actually be coupled to coupling point 14*b*-2 of the second feeder phase line through connection 15*a* (shown as a solid line). Accordingly, a topology error corresponding to branch 16*b* may be identified through application of the voltage difference method above using coupling point 14*b*-1 as the common coupling point, and may be confirmed through successive bottom up voltage analysis using any of nearby coupling points 14*a*-1 to 14*d*-1. Since branch 16*b* is actually coupled to the second feeder phase line, which provides electricity having a different voltage amplitude and voltage variation shape compared to the first feeder phase line, the voltage profile for branch 16*b* will be different than the voltage profiles for coupling points 14*a*-1 to 14*d*-1 of the first feeder phase line; the voltage profile for branch 16*b* will not match or fit in between any voltage profiles for coupling points 14*a*-1 to 14*d*-1 in the same way as shown for FIG. 14 above. Consequently, this suggests that branch 16*b* may be coupled to a different feeder phase line. Accordingly, the voltage profile for branch 16*b* can be compared to the voltage profiles of coupling points 14*a*-2 to 14*d*-2 in the second feeder phase line to determine whether it matches or fits between any voltage profiles of corresponding coupling points 14*a*-2 to 14*d*-2. In this way, and by analogously applying the voltage profile analysis described above in FIGS. 13-14 to different feeder phase lines, the correct mapping between branches corresponding to topology errors and other coupling points in different feeder phase lines can be ascertained. In this embodiment, application of the voltage difference method and voltage profile analysis may determine that branch 16*b* is connected to coupling point 14*b*-2 of the second feeder line, and topology records may be updated to remove the erroneous connection 15*b* shown in FIG. 15 and replace it with connection 15*a* showing that branch 16*b* is coupled to coupling point 14*b*-2 in the field.

While the foregoing examples illustrate the use of instantaneous voltage and current measurements from the meters in deriving the voltage estimates, in other embodiments, time integrated measurements can be used from the meters. For example, performing time integration on equation (1) will result in a time integrated voltage estimate of:

$$V_{PCC1}h = V_{m1} \cdot h + Z_{S1} \cdot I_1 h \quad (23)$$

where V·h and I·h (or A·h) are readings that are readily attainable from meters. Accordingly, time integrated voltage estimates may also be used instead of voltage estimates in the disclosed voltage difference method, and the detection criterion can also be determined according to time integrated voltage measurements. I·h can also approximated from V·h, KWh and/or KVarh according to the type of meters used. The use of time integrated meter values may help provide averaged or scaled values that can reduce the effect of fluctuations caused by the meter, noise, interference, or electricity use by a consumer.

The foregoing example embodiments may also be encoded on to a computer readable medium that is executable by a computer implemented system, or any suitably configured controller or processor so as to perform the voltage difference method described above. The computer readable medium may comprise a CD-ROM, magnetic drive, flash memory, RAM, or any other suitable disc or semiconductor based memory.

While particular embodiments have been described in the foregoing, it is to be understood that other embodiments are possible and are intended to be included herein. It will be clear to any person skilled in the art that modifications of and adjustments to the foregoing embodiments, not shown, are possible.

The invention claimed is:

1. A method for identifying a system anomaly in a power distribution system, the method comprising:
   a) selecting a common coupling point in the power distribution system, wherein multiple downstream branches are connected to the common coupling point;
   b) determining multiple voltage estimates of the common coupling point by, for each one of the downstream branches,
      i) performing one or more electrical measurements at the downstream branch; and
      ii) determining a voltage estimate of the common coupling point based on the one or more electrical measurements performed at the downstream branch;
   c) comparing the multiple voltage estimates of the common coupling point;
   d) determining, based on the comparison, whether a detection criterion is satisfied;
   e) if the detection criterion is satisfied, identifying the system anomaly, wherein the identified system anomaly is one or more of:
      (i) in a power company's internal topological records, a topological anomaly in a branch connected to the common coupling point;
      (ii) in a power company's internal topological records, a topological anomaly in a parameter value of a component in a branch connected to the common coupling point;
      (iii) an identification of a branch current coupled to the common coupling point that is connected to a point other than as found in internal topological records of a power company; and
      (iv) a potential theft of power; and
   f) in response to identifying the system anomaly, one or more of:
      if the identified system anomaly is the system anomaly of e(i), updating the power company's internal topological records;
      if the identified system anomaly is the system anomaly of e(ii), replacing the component in the branch where the topological anomaly was identified with a component having a correct parameter value or updating the internal topological records of the power company for the component with a parameter value of the identified anomaly;
      if the identified system anomaly is the system anomaly of e(iii), updating the internal topological records of the power company to match the actual connection point for the branch circuit; and
      if the identified system anomaly is the system anomaly of e(iv), investigating and rectifying the power loss.

2. The method of claim 1 wherein each of the voltage estimates is determined according to a voltage measured across any location of the corresponding downstream branch.

3. The method of claim 1 wherein the detection criterion is satisfied if any one of the voltage estimates differs beyond a certain value from any other one of the voltage estimates.

4. The method of claim 1 further comprising normalizing the voltage estimates, wherein the system anomaly is identified according to whether any of the normalized voltage estimates satisfy the detection criterion.

5. The method of claim 4 wherein the detection criterion is satisfied if any one of the normalized voltage estimates differs beyond a certain range from any other one of the normalized voltage estimates.

6. The method of claim 2, wherein, in b) ii), determining the voltage estimate of the common coupling point comprises: determining multiple first voltage estimates of the common coupling point based on the one or more electrical measurements performed at the downstream branch; and determining an average second voltage estimate of the common coupling point based on the multiple first voltage estimates.

7. The method of claim 1 further comprising performing a statistical analysis of the voltage estimates, wherein whether the detection criterion is satisfied depends on the results of the statistical analysis.

8. The method of claim 7 wherein the voltage estimates are obtained through samples of the common coupling point obtained over a period of time.

9. The method of claim 8 further comprising performing the statistical analysis by:
   a) incrementing a violation count for each sample containing at least a voltage estimate satisfying a threshold;
   b) determining a violation ratio by dividing the violation count by the number of samples obtained over the period of time; and
   c) determining whether the detection criterion is satisfied according to whether the violation ratio meets or exceeds a predetermined ratio.

10. The method of claim 1 wherein the system anomaly is located in a downstream branch corresponding to the voltage estimate satisfying the detection criterion.

11. The method of claim 1 wherein the electrical measurements are selected from the group consisting of voltage, current, power, energy, time integrated voltage, and time integrated current, and each downstream branch comprises a meter for measuring the one or more electrical measurements at the downstream branch.

12. The method of claim 11 wherein each of the voltage estimates is determined by summing voltage drops across components upstream of the meter and downstream of the common coupling point for the corresponding downstream branch.

13. The method of claim 1 wherein the identified system anomaly is located upstream of a meter.

14. The method of claim 1 wherein the system anomaly is a nontechnical loss.

15. The method of claim 14 wherein the magnitude of the non-technical loss is determined according to a difference between the voltage estimates.

16. The method of claim 1 wherein the system anomaly is a topology error.

17. The method of claim 16 wherein the topology error comprises an incorrect branch connection, an incorrect transformer impedance, or an incorrect wire impedance.

18. The method of claim 17 wherein the topology error comprises the incorrect branch connection, and the method further comprises performing a voltage profile analysis to determine a correct mapping for the incorrect branch connection.

19. The method of claim 18 wherein the voltage profile analysis comprises:
   a) determining a voltage profile for a downstream branch corresponding to the topology error;
   b) determining voltage profiles for coupling points in the power distribution system;
   c) comparing the voltage profile for the downstream branch corresponding to the topology error to the voltage profiles for the coupling points in the power distribution system; and
   d) mapping the downstream branch corresponding to the topology error to one of the coupling points in the power distribution system accordingly.

20. The method of claim 1 wherein the downstream branches are coupled in parallel to the common coupling point.

21. The method of claim 1 wherein the downstream branches are coupled to the common coupling point in a cascade configuration.

22. The method of claim 1 wherein the common coupling point is located on a primary side of the power distribution system.

23. The method of claim 1 wherein the common coupling point is located on a secondary side of the power distribution system.

24. A non-transitory computer readable medium having encoded thereon statements and instructions for executing a method for identifying a system anomaly in a power distribution system, the method comprising:
   a) selecting a common coupling point in the power distribution system, wherein multiple downstream branches are connected to the common coupling point;
   b) determining multiple voltage estimates of the common coupling point by, for each one of the downstream branches,
      i) obtaining one or more electrical measurements at the downstream branch; and
      ii) determining a voltage estimate of the common coupling point based on the one or more electrical measurements obtained at the downstream branch;
   c) comparing the multiple voltage estimates of the common coupling point;
   d) determining, based on the comparison, whether a detection criterion is satisfied;
   e) if the detection criterion is satisfied, identifying the system anomaly, wherein the identified system anomaly is one or more of:
      (i) in a power company's internal topological records, a topological anomaly in a branch connected to the common coupling point;
      (ii) in a power company's internal topological records, a topological anomaly in a parameter value of a component in a branch connected to the common coupling point;
      (iii) an identification of a branch current coupled to the common coupling point that is connected to a point other than as found in internal topological records of a power company; and
      (iv) a potential theft of power; and
   f) in response to identifying the system anomaly, one or more of:
      if the identified system anomaly is the system anomaly of e(i), updating the power company's internal topological records;
      if the identified system anomaly is the system anomaly of e(ii), replacing the component in the branch where the topological anomaly was identified with a component having a correct parameter value or updating the internal topological records of the power company for the component with a parameter value of the identified anomaly;
      if the identified system anomaly is the system anomaly of e(iii), updating the internal topological records of the power company to match the actual connection point for the branch circuit; and
      if the identified system anomaly is the system anomaly of e(iv), investigating and rectifying the power loss.

25. A system for identifying a system anomaly in a power distribution system, the system comprising:
   a non-transitory computer readable medium having encoded thereon statements and instructions for:
      a) selecting a common coupling point in the power distribution system, wherein multiple downstream branches are connected to the common coupling point;
      b) determining multiple voltage estimates of the common coupling point by, for each one of the downstream branches,
         i) obtaining one or more electrical measurements at the downstream branch; and
         ii) determining a voltage estimate of the common coupling point based on the one or more electrical measurements obtained at the downstream branch;
      c) comparing the multiple voltage estimates of the common coupling point;
      d) determining, based on the comparison, whether a detection criterion is satisfied;
      e) if the detection criterion is satisfied, identifying the system anomaly, wherein the identified system anomaly is one or more of:
         (i) in a power company's internal topological records, a topological anomaly in a branch connected to the common coupling point;
         (ii) in a power company's internal topological records, a topological anomaly in a parameter value of a component in a branch connected to the common coupling point;
         (iii) an identification of a branch current coupled to the common coupling point that is connected to a point other than as found in internal topological records of a power company; and
         (iv) a potential theft of power; and
      f) in response to identifying the system anomaly, one or more of:

if the identified system anomaly is the system anomaly of e(i), updating the power company's internal topological records;

if the identified system anomaly is the system anomaly of e(ii), replacing the component in the branch where the topological anomaly was identified with a component having a correct parameter value or updating the internal topological records of the power company for the component with a parameter value of the identified anomaly;

if the identified system anomaly is the system anomaly of e(iii), updating the internal topological records of the power company to match the actual connection point for the branch circuit; and if the identified system anomaly is the system anomaly of e(iv), investigating and rectifying the power loss; and a processor for executing the statements and instructions on the computer readable medium.

* * * * *